United States Patent
Chang et al.

(10) Patent No.: US 12,268,103 B2
(45) Date of Patent: Apr. 1, 2025

(54) PHASE CHANGE MATERIAL SWITCH WITH IMPROVED THERMAL CONFINEMENT AND METHODS FOR FORMING THE SAME

(71) Applicant: Taiwan Semiconductor Manufacturing Company Limited, Hsinchu (TW)

(72) Inventors: Kuo-Pin Chang, Hsinchu (TW); Yu-Wei Ting, Taipei (TW); Tsung-Hao Yeh, Hsinchu (TW); Kuo-Chyuan Tzeng, Chu-Pei (TW); Kuo-Ching Huang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 484 days.

(21) Appl. No.: 17/836,145

(22) Filed: Jun. 9, 2022

(65) Prior Publication Data

US 2023/0403954 A1 Dec. 14, 2023

(51) Int. Cl.
*H01L 45/00* (2006.01)
*H10N 70/00* (2023.01)
*H10N 70/20* (2023.01)

(52) U.S. Cl.
CPC ....... *H10N 70/8413* (2023.02); *H10N 70/063* (2023.02); *H10N 70/231* (2023.02); *H10N 70/823* (2023.02); *H10N 70/8828* (2023.02)

(58) Field of Classification Search
CPC ............ H10N 70/8413; H10N 70/063; H10N 70/231; H10N 70/823; H10N 70/8828; H10N 79/00; H10N 70/8613
See application file for complete search history.

(56) References Cited

U.S. PATENT DOCUMENTS

2006/0266991 A1 * 11/2006 Chang .................. H10N 70/231
257/4
2009/0127536 A1 * 5/2009 Nirschl .............. H10N 70/8828
257/E45.001
(Continued)

FOREIGN PATENT DOCUMENTS

TW 201830686 A 8/2018
TW 201834289 A 9/2018
(Continued)

OTHER PUBLICATIONS

TW Patent and Trademark Office; TW Application No. 112120440; Office Action mailed Jan. 10, 2024, 10 pages.

*Primary Examiner* — Ermias T Woldegeorgis
(74) *Attorney, Agent, or Firm* — The Marbury Law Group, PLLC

(57) ABSTRACT

Phase change material (PCM) switches and methods of fabrication thereof that provide improved thermal confinement within a phase change material layer. A PCM switch may include a dielectric capping layer between a heater pad and the phase change material layer of the PCM switch that is laterally-confined such opposing sides of the dielectric capping layer the heater pad may form continuous surfaces extending transverse to the signal transmission pathway across the PCM switch. Heat transfer from the heater pad through the dielectric capping layer to the phase change material layer may be predominantly vertical, with minimal thermal dissipation along a lateral direction. The localized heating of the phase change material may improve the efficiency of the PCM switch enabling lower bias voltages, minimize the formation of regions of intermediate resistivity in the PCM switch, and improve the parasitic capacitance characteristics of the PCM switch.

20 Claims, 27 Drawing Sheets

(56) References Cited

U.S. PATENT DOCUMENTS

| | | |
|---|---|---|
| 2018/0351069 A1 | 12/2018 | Boukai et al. |
| 2018/0358557 A1 | 12/2018 | Jung |
| 2020/0136043 A1 | 4/2020 | Ok et al. |
| 2021/0391006 A1 | 12/2021 | Futase |

FOREIGN PATENT DOCUMENTS

| | | |
|---|---|---|
| TW | 202036892 A | 10/2020 |
| TW | 202131511 A | 8/2021 |
| TW | 202141823 A | 11/2021 |
| TW | 202147522 A | 12/2021 |

\* cited by examiner

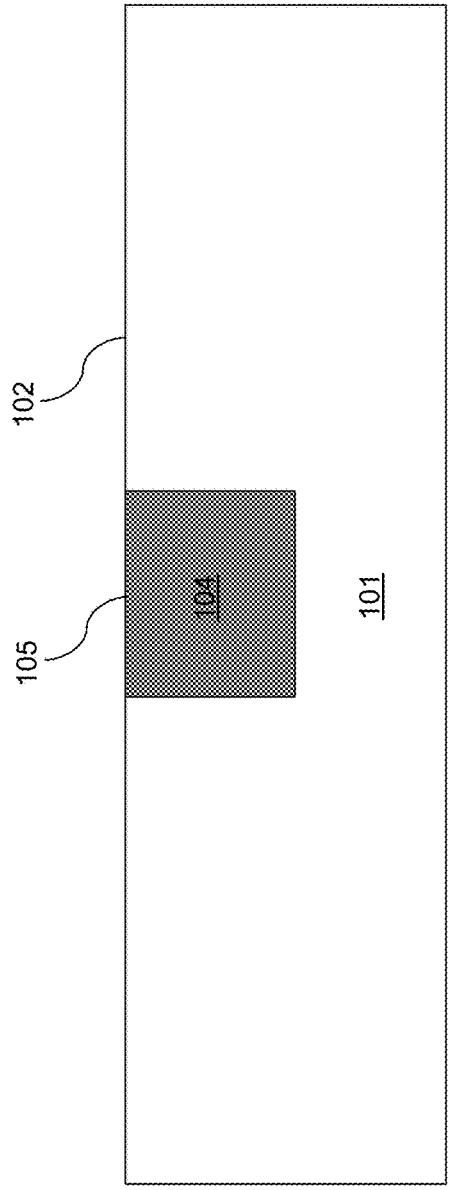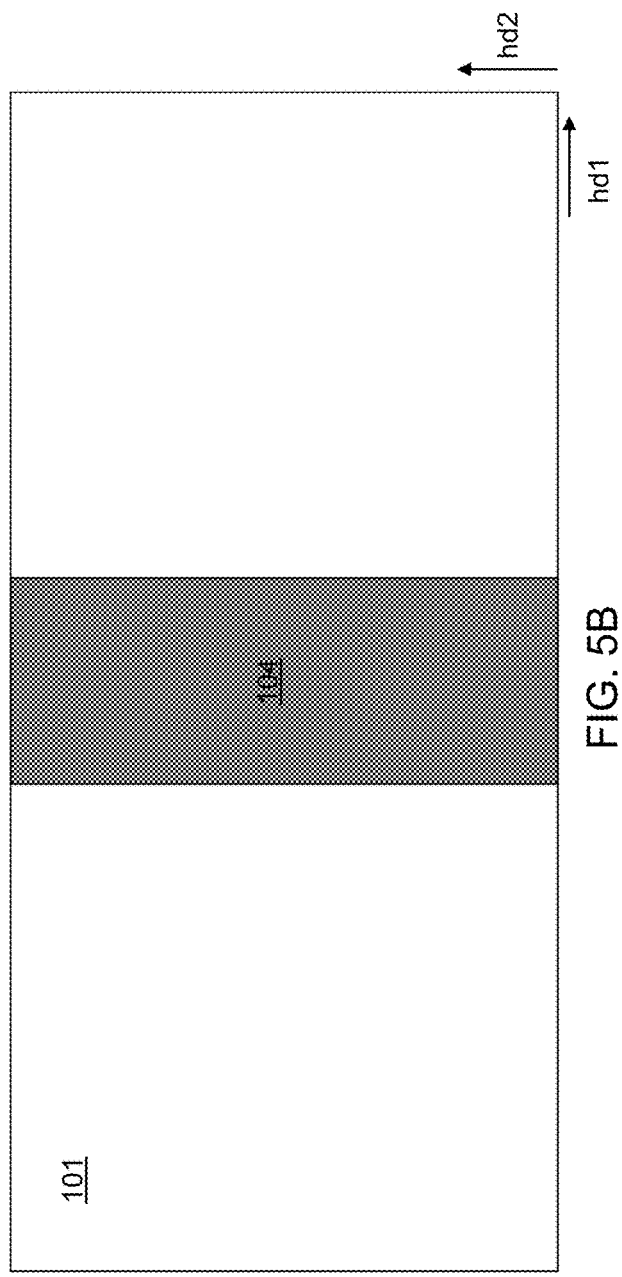

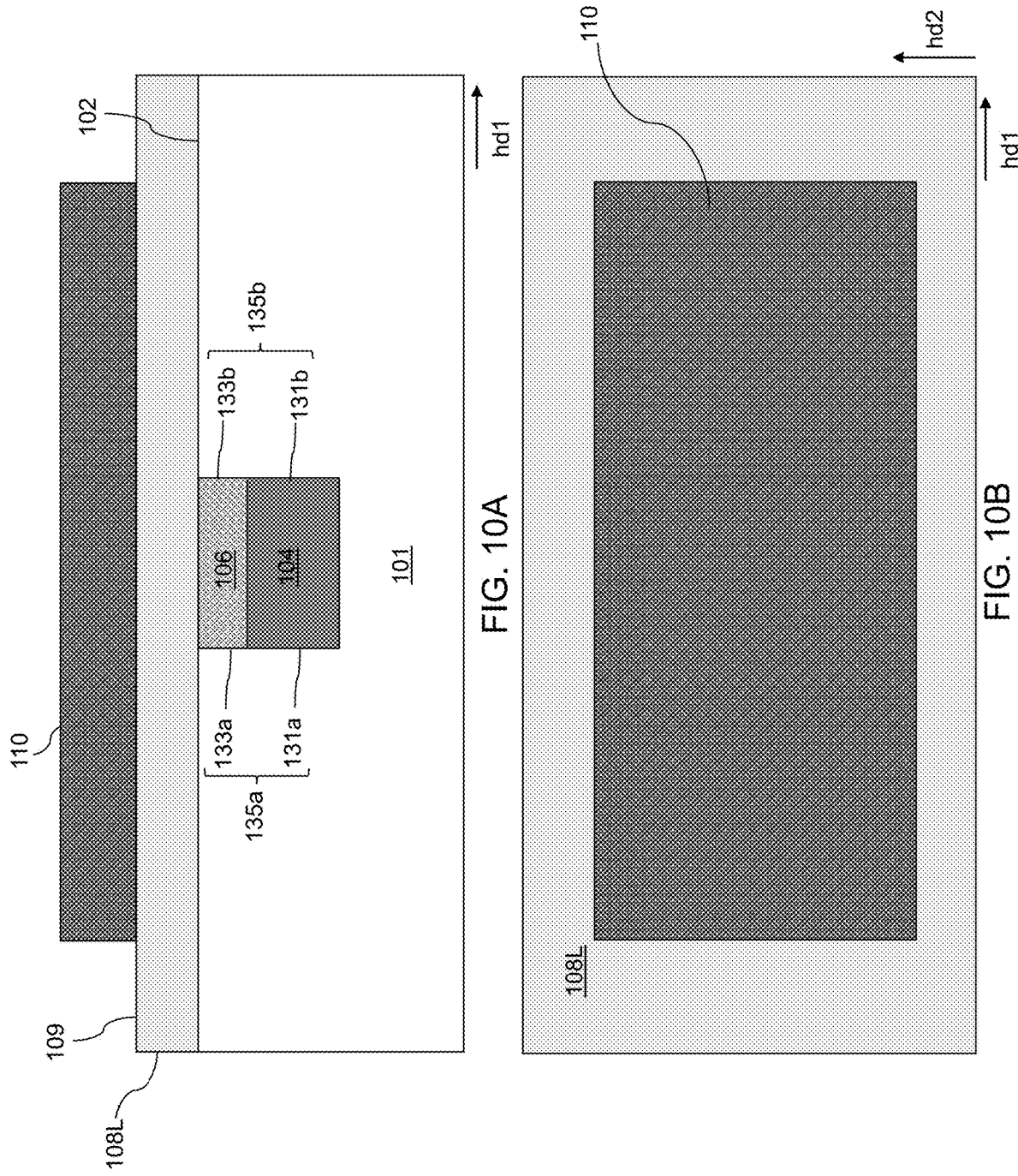

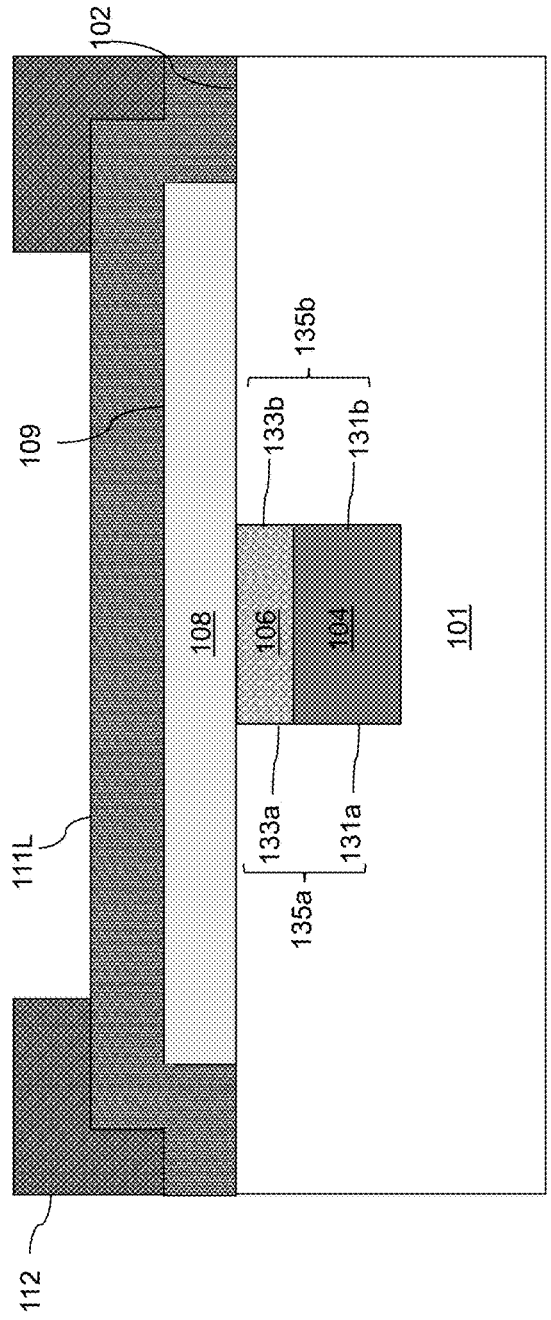
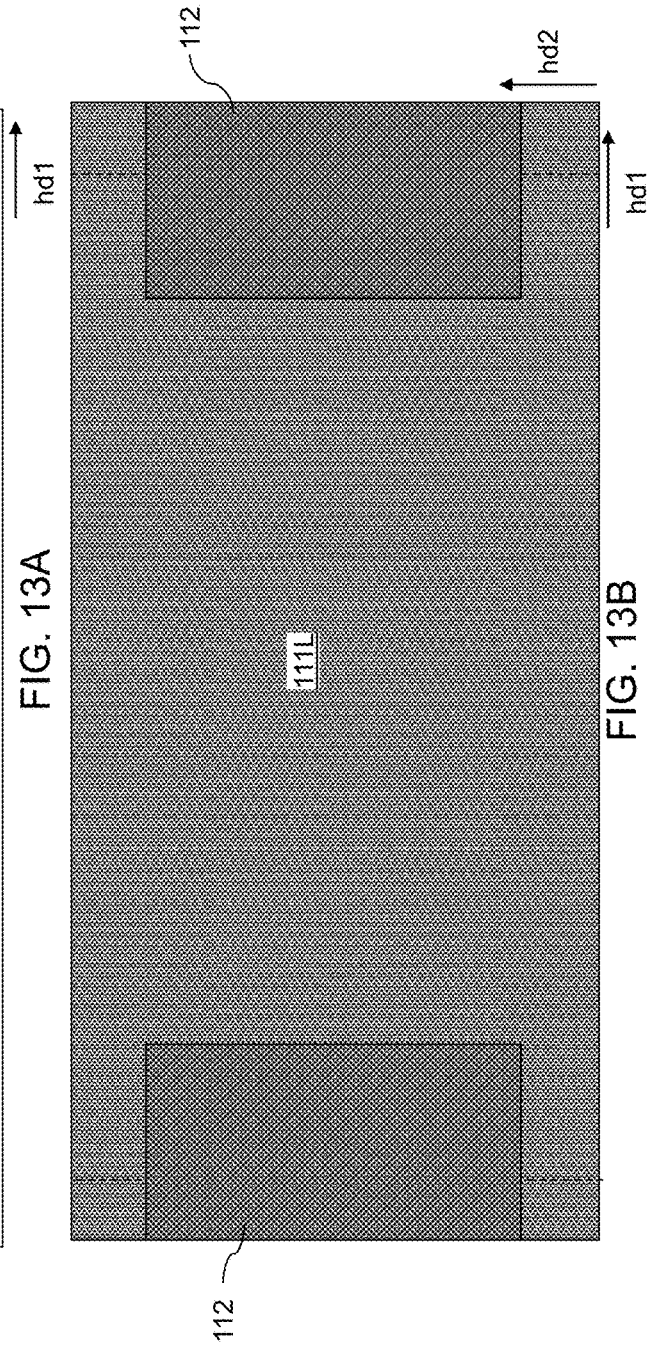
FIG. 13A
FIG. 13B

PHASE CHANGE MATERIAL SWITCH WITH IMPROVED THERMAL CONFINEMENT AND METHODS FOR FORMING THE SAME

BACKGROUND

Phase change material (PCM) switches are used for various applications such as radio-frequency applications. Advantages of PCM switches include their immunity to interference by electromagnetic radiation, relatively fast switching times, and ability to maintain their switching state (i.e., "On" or "Off") without consuming electrical power.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A is a vertical cross-section view of an exemplary intermediate structure during a process of forming a PCM switch illustrating a heater pad embedded within the first dielectric material layer according to an embodiment of the present disclosure.

FIG. 5B is a top view of the exemplary intermediate structure of FIG. 5A.

FIG. 10A is a vertical cross-section view of an exemplary intermediate structure during a process of forming a PCM switch illustrating a patterned mask over the continuous PCM layer according to an embodiment of the present disclosure.

FIG. 10B is a top view of the exemplary intermediate structure of FIG. 10A.

FIG. 13A is a vertical cross-section view of an exemplary intermediate structure during a process of forming a PCM switch illustrating a patterned mask over the continuous electrode layer according to an embodiment of the present disclosure.

FIG. 13B is a top view of the exemplary intermediate structure of FIG. 13A.

DETAILED DESCRIPTION

Figure 1:
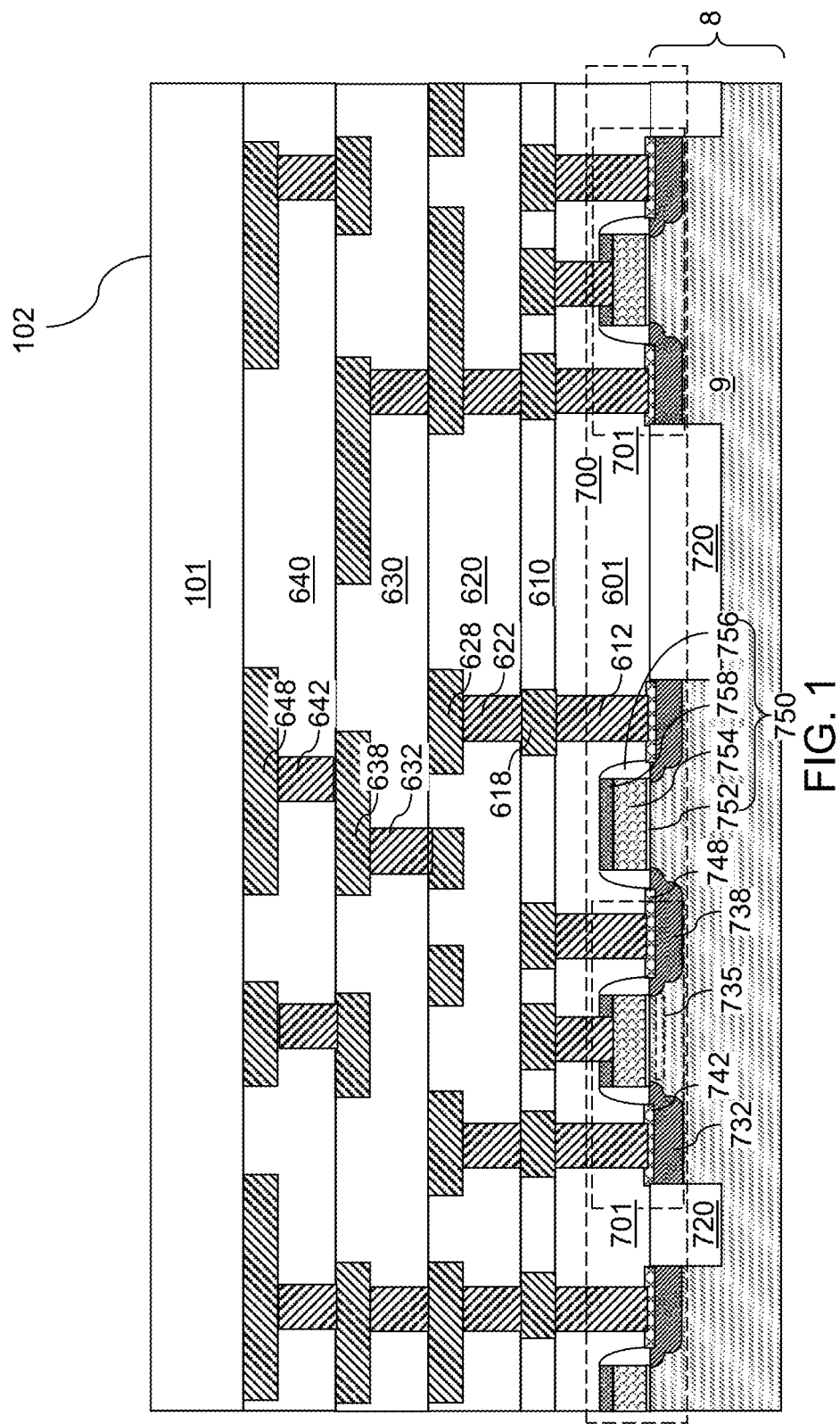
FIG. 1 is a vertical cross-sectional view of a first exemplary structure after formation of complementary metal-oxide-semiconductor (CMOS) transistors, metal interconnect structures and dielectric material layers according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the various embodiment structures and methods of the present disclosure may be used to form a phase change material (PCM) switch, which may be used to provide a switching function for various semiconductor devices such as radio-frequency semiconductor devices, varactors (i.e., variable capacitance capacitors), inductors, or other semiconductor devices.

As used herein, a "phase change material" refers to a material having at least two different phases providing different resistivity. The different phases may include an amorphous state having high resistivity and a crystalline state having low resistivity (i.e., a lower resistivity than in the amorphous state). The transition between the amorphous state and the crystalline state may be induced by controlling a time-versus-temperature thermal profile within the phase change material. In particular, a PCM switch may include a resistive heating element thermally coupled to the phase change material and configured to selectively heat the phase change material via the application of current pulses through the resistive heating element.

To induce a transition of the phase change material from a low-resistivity crystalline state to a high-resistivity amorphous state, the current pulse through the resistive heating element may have a relatively short pulse width with a short falling time that is configured to quickly heat the phase change material to a temperature above its melting temperature ($T_{melt}$), causing the material to transition from an ordered crystalline low-resistivity phase to a disordered amorphous high-resistivity phase. The short falling time of the pulse promotes rapid quenching and inhibits re-crystallization of the material as it cools.

To induce a transition of the phase change material from a high-resistivity amorphous state to a low-resistivity crystalline state, the current pulse through the resistive heating element may have a relatively longer pulse width with a longer pulse falling time that is configured to heat the phase change material to a temperature above its crystallization temperature ($T_{crys}$), but below its melting temperature ($T_{melt}$), over a time period sufficient to induce crystal nucleation in the material. The comparatively long falling time of the current pulse promotes crystal growth as the phase change material cools at a relatively slower rate.

A PCM switch may include a phase change material disposed within a signal transmission pathway between a pair of electrodes. The resistive heating element may extend across the phase change material in a direction transverse to the signal transmission pathway, and a layer of electrically-insulating and thermally-conductive material may be disposed between the resistive heating element and the phase change material. While the phase change material is in a low-resistivity crystalline state, the PCM switch may be in an "On" state such that signals may be transmitted across the phase change material between the pair of electrodes. However, when a portion of the phase change material along the signal transmission pathway is in a high-resistivity amorphous state, the PCM switch may be in an "Off" state such that signal transmission between the pair of electrodes is blocked. The PCM switch may be switched (i.e., programmed) between the "On" state and the "Off" state by the selective application of current pulses to the resistive heating element having different pulse widths and falling times as described above. The portion of the phase change material that is switched between a low-resistivity crystalline state and a high-resistivity amorphous state may be referred to as the active region of the phase change material.

For a switch used in radio-frequency (RF) applications, relevant factors for evaluating switch performance may include insertion loss, isolation and power handling. In general, low insertion loss and high isolation are desirable characteristics for RF switches. For PCM switches, insertion loss is related to the resistivity across the phase change material when the switch is in the "On" state (i.e., $R_{ON}$), while high isolation is inversely related to the capacitance of the switch while in the "Off" state (i.e., CUFF). A figure of merit (FOM) used to characterize PCM switch performance may be inversely proportional to the product $R_{ON}*C_{OFF}$. For example, one FOM that is used to characterize switch performance is $\sim 1/(2\pi R_{ON} C_{OFF})$, where a higher FOM value equals better switch performance. Thus, switch performance may be improved by reducing the $R_{ON}$ characteristics, the $C_{OFF}$ characteristics, or both, in a PCM switch.

Existing designs for PCM switches are not optimally efficient because much of the thermal energy generated by the resistive heating element is spread laterally by the layer of electrically-insulating and thermally-conductive material located between the resistive heating element and the phase change material. Accordingly, during a switching operation, the peak temperature in the active region of the phase change material is relatively low, and a high bias voltage across the resistive heating element is needed in order to provide sufficient heating to induce the desired phase change in the active region of the phase change material. Moreover, because much of the thermal energy is diffused laterally, the active region may be relatively large, and portions of the phase change material outside of the active region may inadvertently become "soft programmed" to have an intermediate resistivity state that is between the high-resistivity "Off" state and the low-resistivity "On" state of the PCM switch. This may result in undesired parasitic resistance across the phase change material that may increase the $R_{ON}$ characteristics of the PCM switch. Further, the electrically-insulating and thermally-conductive material located between the resistive heating element and the phase change material is typically a high-k dielectric material that may contribute to a high $C_{OFF}$ characteristic of the PCM switch.

In order to address these deficiencies, various embodiments disclosed herein include PCM switches that provide improved thermal confinement within the phase change material layer. In various embodiments, the thermally-conductive dielectric capping layer located between the heater pad and the phase change material layer of the PCM switch may be laterally-confined such opposing sides of the dielectric capping layer and opposing sides of the underlying heater pad may form continuous surfaces extending transverse to the signal transmission pathway across the phase change material between the pair of electrodes. The heat transfer from the heater pad through the dielectric capping layer to the phase change material layer may be predominantly along a vertically upwards direction, such that heating of the phase change material layer may be nearly exclusively confined to a region of the phase change material layer located directly above the heater pad, with minimal thermal dissipation along a lateral direction. This localized heating of the phase change material may improve the efficiency of the PCM switch by enabling the use of lower bias voltages across the heater pad, and may minimize the occurrence of unwanted intermediate resistivity states within the phase change material layer. This may, in turn, improve the $R_{ON}$ characteristics of the PCM switch. Further, because the laterally-confined dielectric capping layer is laterally offset from the electrodes contacting the phase change material layer, the relatively high-k dielectric capping layer may not significantly contribute to the $C_{OFF}$ characteristics of the switch. Accordingly, a high-performance PCM switch with an increased figure of merit (FOM) may be provided.

FIG. 1 is a vertical cross-sectional view of a first exemplary structure prior to formation of a PCM switch according to various embodiments of the present disclosure. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738. The devices formed on the top surface of the semiconductor material layer 9 may include complementary metal-oxide-semiconductor (CMOS) transistors and optionally additional semiconductor devices (such as resistors, diodes, capacitor structures, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a subset of the field effect transistors 701 in the CMOS circuitry 700 may include a respective node that is subsequently electrically connected to a node of a PCM switch to be subsequently formed.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

Various metal interconnect structures formed within dielectric material layers may be subsequently formed over the substrate 8 and the semiconductor devices 701 thereupon (such as field effect transistors). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, a second interconnect-level dielectric material layer 620, a third interconnect-level dielectric material layer 630, and a fourth interconnect-level dielectric material layer 640. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, second metal line structures 628 formed in an upper portion of the second interconnect-level dielectric material layer 620, second metal via structures 632 formed in a lower portion of the third interconnect-level dielectric material layer 630, third metal line structures 638 formed in an upper portion of the third interconnect-level dielectric material layer 630, third metal via structures 642 formed in a lower portion of the fourth interconnect-level dielectric material layer 640, and fourth metal line structures 648 formed in an upper portion of the fourth interconnect-level dielectric material layer 640. While the present disclosure is described using an embodiment in which four levels metal line structures are formed in dielectric material layers, embodiments are expressly contemplated herein in which a lesser or greater number of levels of metal line structures are formed in dielectric material layers.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 631, 638, 642, 648) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. Generally, any contiguous set of a metal line structure (628, 638, 648) and at least one underlying metal via structure (622, 632, 642) may be formed as an integrated line and via structure.

Generally, semiconductor devices 701 may be formed on a substrate 8, and metal interconnect structures (612, 618, 622, 628, 631, 638, 642, 648) and dielectric material layers (601, 610, 620, 630, 640) over the semiconductor devices 701. The metal interconnect structures (612, 618, 622, 628, 631, 638, 642, 648) may be formed in the dielectric material layers (601, 610, 620, 630, 640), and may be electrically connected to the semiconductor devices.

Referring again to FIG. 1, a first dielectric material layer 101 may be formed over the metal interconnect structures (612, 618, 622, 628, 631, 638, 642, 648) and dielectric material layers (601, 610, 620, 630, 640). The first dielectric material layer 101 may include a suitable dielectric material, such as silicon oxide, undoped silicate glass, a doped silicate glass, organosilicate glass, amorphous fluorinated carbon, porous variants thereof, or combinations thereof. Other suitable dielectric materials are within the contemplated scope of disclosure. The first dielectric material layer 101 may be deposited using any suitable deposition process, such a chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like. The first dielectric material layer 101 may include a planar upper surface 102.

Figure 2:
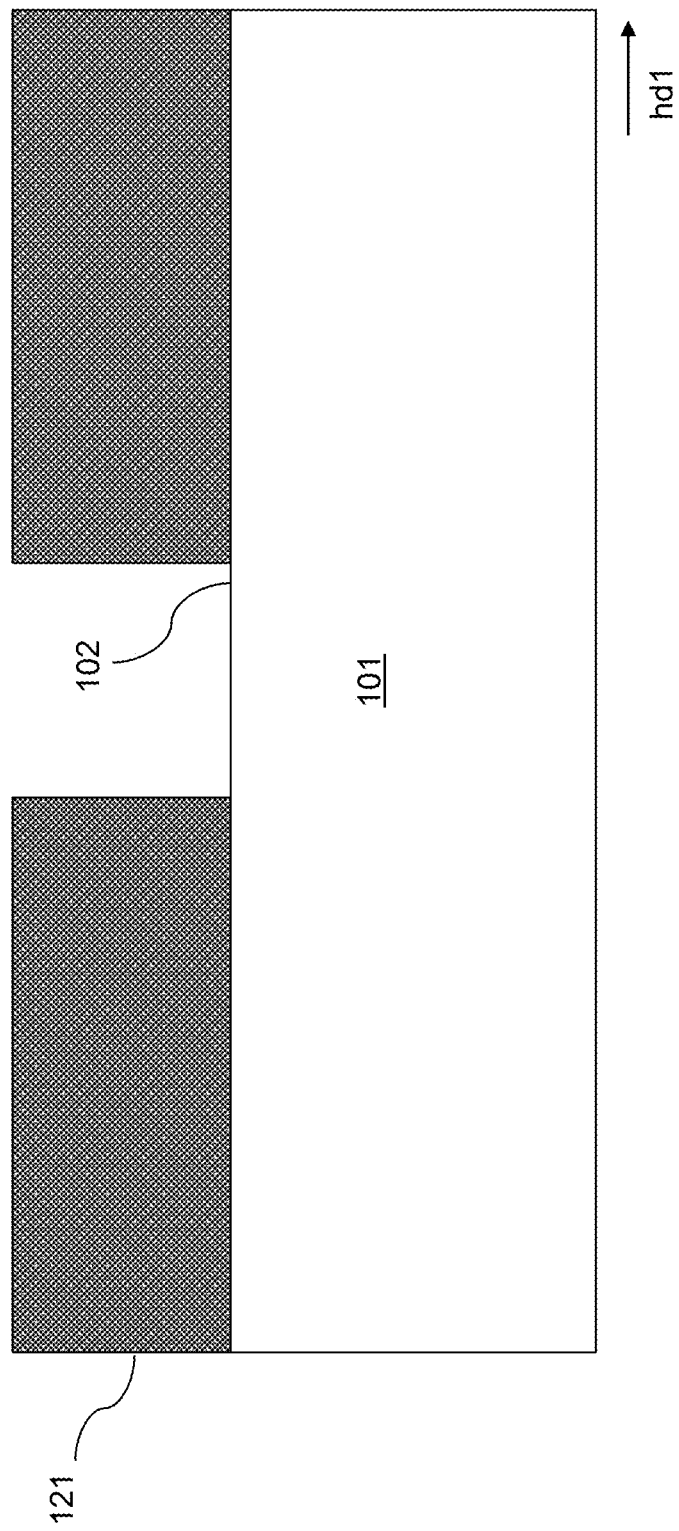
FIG. 2 is a vertical cross-section view of an exemplary intermediate structure during a process of forming a phase change material (PCM) switch that includes a patterned mask over the upper surface of a first dielectric material layer according to an embodiment of the present disclosure.

FIG. 2 is a vertical cross-section view of an exemplary intermediate structure during a process of forming a PCM switch that includes a patterned mask 121 over the upper surface 102 of a first dielectric material layer 101 according to an embodiment of the present disclosure. In various embodiments, the first dielectric material layer 101 may be the uppermost layer of an exemplary structure that includes CMOS circuitry, metal interconnect structures and dielectric material layers over a substrate such as shown in FIG. 1. Referring to FIG. 2, the patterned mask 121, which may include a layer of photoresist and/or a hard mask, may be patterned using a photolithographic technique to form an opening through the mask corresponding to the location of a heater pad for a PCM switch to be subsequently formed.

Figure 3:
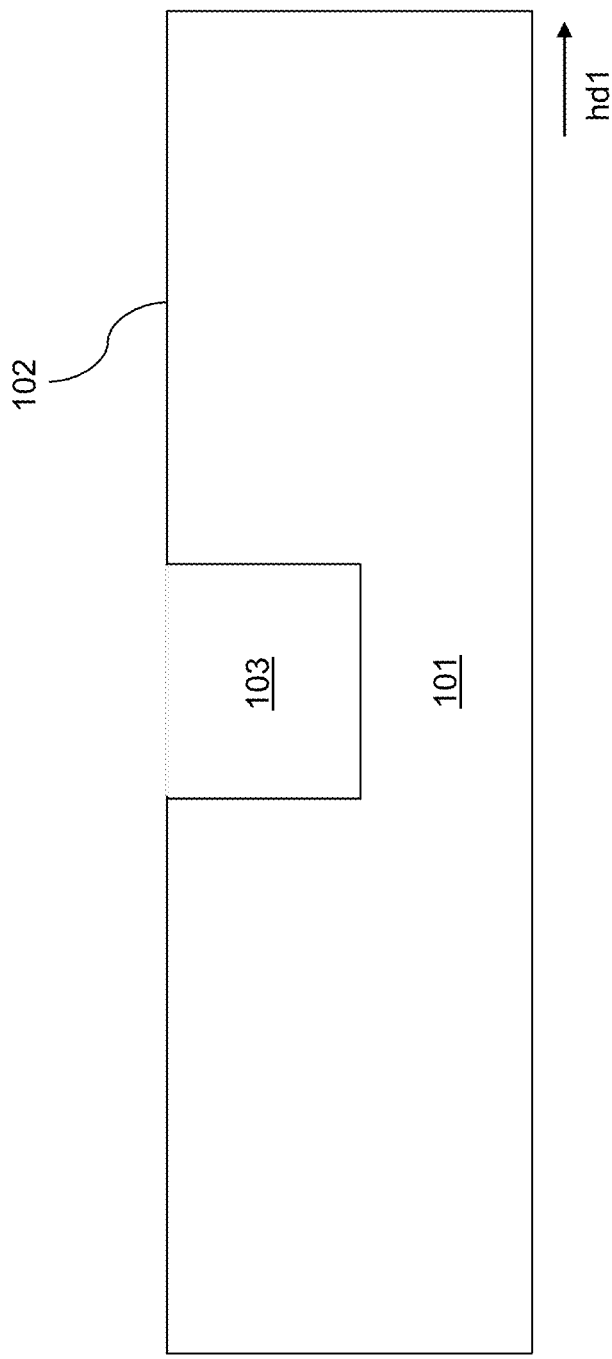
FIG. 3 is a vertical cross-section view of an exemplary intermediate structure during a process of forming a PCM switch illustrating a trench formed in the first dielectric material layer according to an embodiment of the present disclosure.

FIG. 3 is a vertical cross-section view of an exemplary intermediate structure during a process of forming a PCM switch illustrating a trench 103 formed in the first dielectric material layer 101 according to an embodiment of the present disclosure. Referring to FIG. 3, an anisotropic etch process, such as a reactive ion etch process, may be performed to etch a portion of the dielectric material layer 101 exposed through the opening in the patterned mask 121 and form the trench 103 in the first dielectric material layer 101. In the exemplary intermediate structure shown in FIG. 3, the trench 103 has a rectangular cross-section shape in a plane extending along horizontal direction hd1, including a horizontal bottom surface and vertically-extending sidewalls. However, it will be understood that the trench 103 may have a different cross-sectional shape, such as a trapezoidal cross-section shape, and the sidewalls of the trench may include angled or curved surfaces. Following the etching process, the patterned mask 121 may be removed using a suitable process, such as via ashing or dissolution using a solvent.

Figure 4:
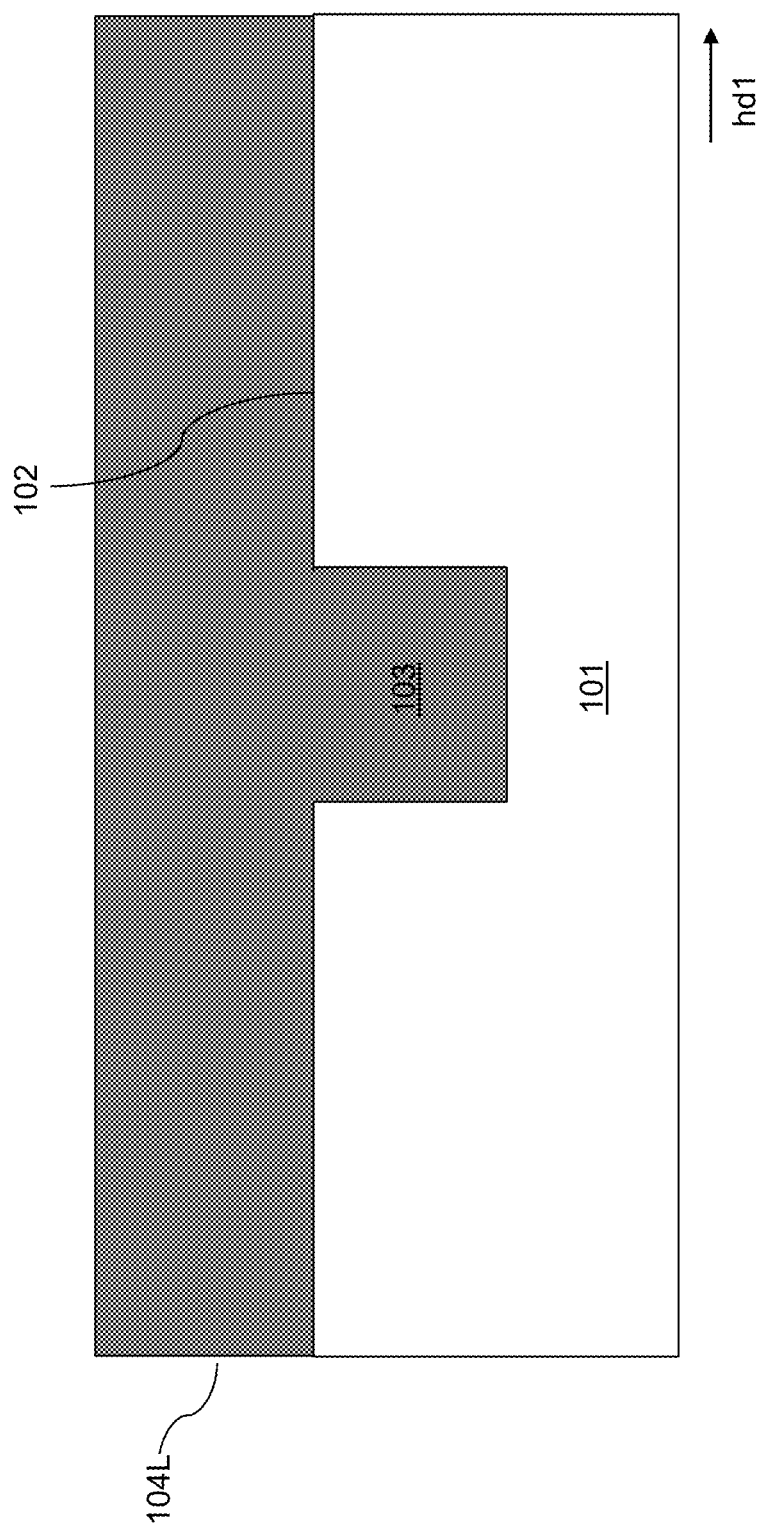
FIG. 4 is a vertical cross-section view of an exemplary intermediate structure during a process of forming a PCM switch illustrating a continuous heater material layer formed over the upper surface of the first dielectric material layer and within the trench according to an embodiment of the present disclosure.

FIG. 4 is a vertical cross-section view of an exemplary intermediate structure during a process of forming a PCM switch illustrating a continuous heater material layer 104L formed over the upper surface 102 of the first dielectric material layer 101 and within the trench 103 according to an embodiment of the present disclosure. Referring to FIG. 4, the continuous heater material layer 104L may include a metallic material having a relatively high melting point and low electrical resistivity. In some embodiments, the continuous heater material layer 104L may include a refractory metal, such as tungsten, a conductive metallic nitride material, such as tungsten nitride or titanium nitride, and/or a nickel silicide. Other suitable materials for the continuous heater material layer 104L are within the contemplated scope of disclosure. The continuous heater material layer 104L may be deposited using a suitable deposition process, such as physical vapor deposition (PVD), sputtering, chemical vapor deposition (CVD), atomic layer deposition (ALD), plasma-enhanced chemical vapor deposition (PECVD), electrochemical deposition, or combinations thereof.

FIG. 5A is a vertical cross-section view of an exemplary intermediate structure during a process of forming a PCM switch illustrating a heater pad 104 embedded within the first dielectric material layer 101 according to an embodiment of the present disclosure. FIG. 5B is a top view of the exemplary intermediate structure of FIG. 5A. Referring to FIGS. 5A and 5B, a planarization process, such as a chemical mechanical planarization (CMP) process may be used to remove the continuous heater material layer 104L from over the upper surface 102 of the first dielectric material layer 101. The remaining portion of the continuous heater material layer 104L may form a heater pad 104 that may fill the trench 103 in the first dielectric material layer 101. The first dielectric material layer 101 may surround the heater pad 104 over the bottom surface and lateral side surfaces of the heater pad 104. The upper surface 105 of the heater pad 104 may be coplanar with the upper surface 102 of the first dielectric material layer 101.

Figure 6:
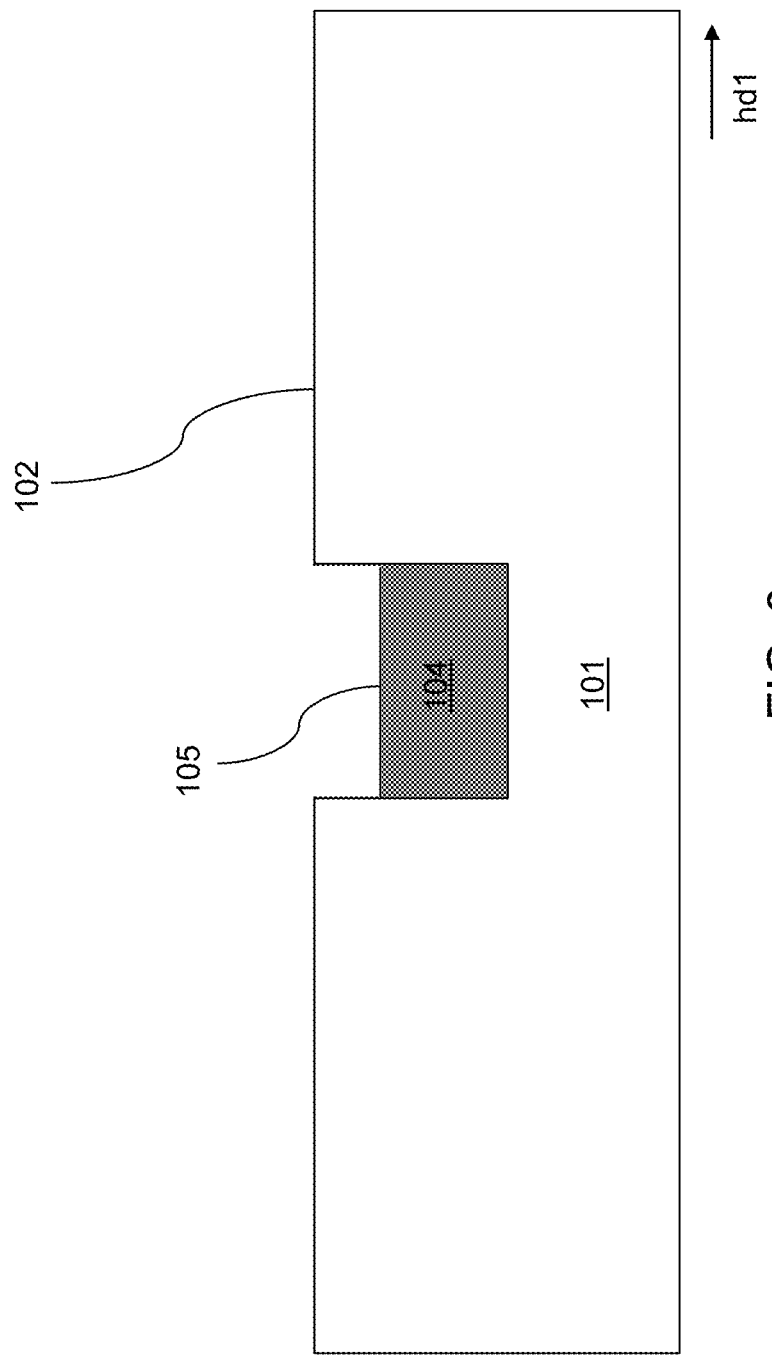
FIG. 6 is a vertical cross-section view of an exemplary intermediate structure during a process of forming a PCM switch illustrating the upper surface of the heater pad vertically recessed with respect to the upper surface of the first dielectric material layer according to an embodiment of the present disclosure.

FIG. 6 is a vertical cross-section view of an exemplary intermediate structure during a process of forming a PCM switch illustrating the upper surface 105 of the heater pad 104 vertically recessed with respect to the upper surface 102 of the first dielectric material layer 101 according to an embodiment of the present disclosure. Referring to FIG. 6, an etching process may be performed that may selectively etch the material of the heater pad 104 relative to the material of the first dielectric material layer 101. Following the etching process, the upper surface 105 of the heater pad 104 may be vertically recessed with respect to the upper surface 102 of the first dielectric material layer 101. In various embodiments, the upper surface 105 of the heater pad 104 may be vertically recessed with respect to the upper surface 102 of the first dielectric material layer 101 by at least about 20 nm, such as 20 nm to 100 nm, including from 30 nm to 60 nm, although lesser and greater recess distances may also be used.

Figure 7:
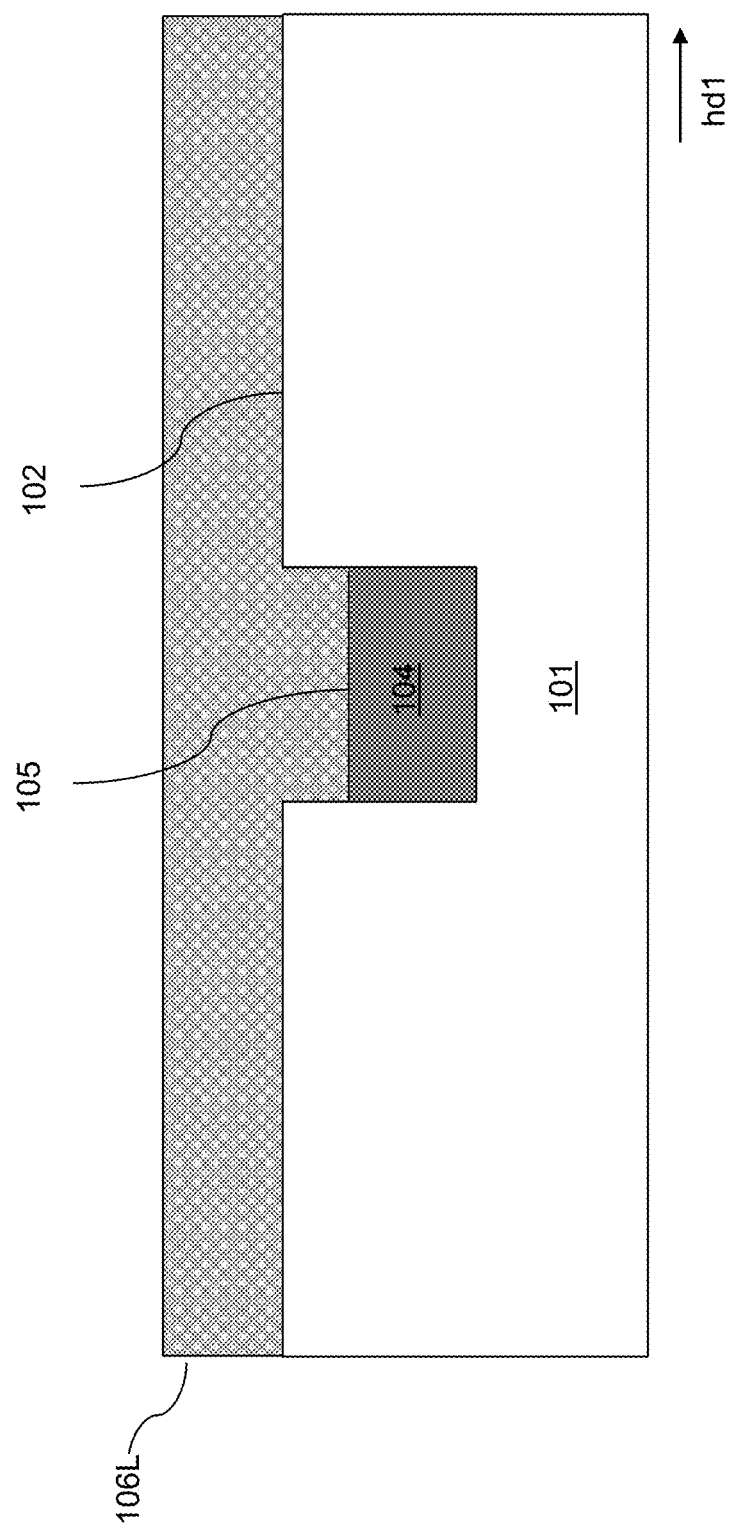
FIG. 7 is a vertical cross-section view of an exemplary intermediate structure during a process of forming a PCM switch showing a continuous dielectric capping layer formed over the upper surface of the first dielectric material layer and over the upper surface of the heater pad according to an embodiment of the present disclosure.

FIG. 7 is a vertical cross-section view of an exemplary intermediate structure during a process of forming a PCM switch showing a continuous dielectric capping layer 106L formed over the upper surface 102 of the first dielectric material layer 101 and over the upper surface 105 of the heater pad 104 according to an embodiment of the present disclosure. Referring to FIG. 7, the continuous dielectric capping layer 106L may be deposited over the upper surface 102 of the first dielectric material layer 101 and over the vertically-recessed upper surface 105 of the heater pad 104. The continuous dielectric capping layer 106L may include a material having relatively high thermal conductivity and good electrical isolation characteristics, such as silicon nitride, silicon carbide, silicon carbide nitride, aluminum nitride, and the like. Other suitable materials for the continuous dielectric material layer 106L are within the contemplated scope of disclosure. The continuous dielectric capping layer 106L may be deposited using a suitable deposition process as described above.

Figure 8A:
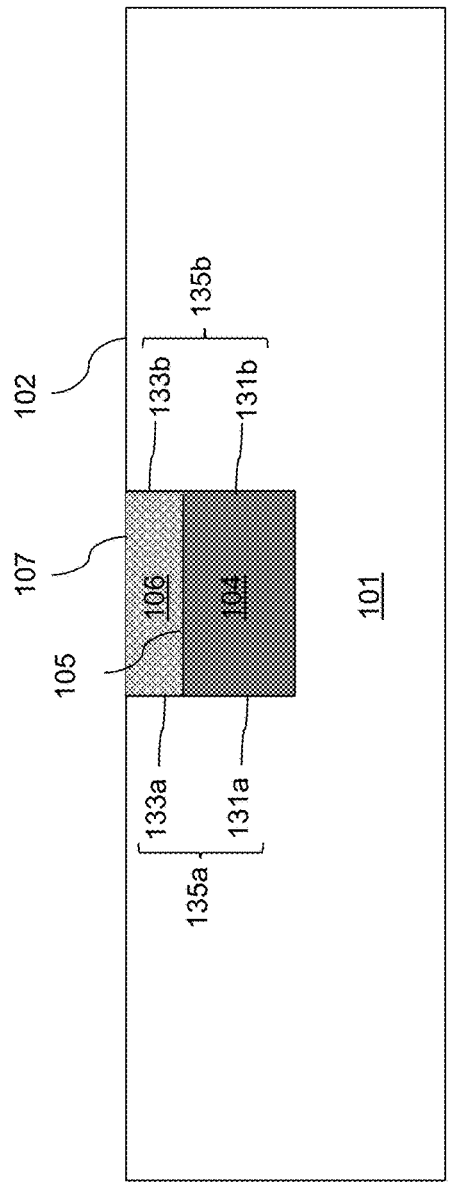
FIG. 8A is a vertical cross-section view of an exemplary intermediate structure during a process of forming a PCM switch illustrating a dielectric capping layer over the heater pad according to an embodiment of the present disclosure.
Figure 8B:
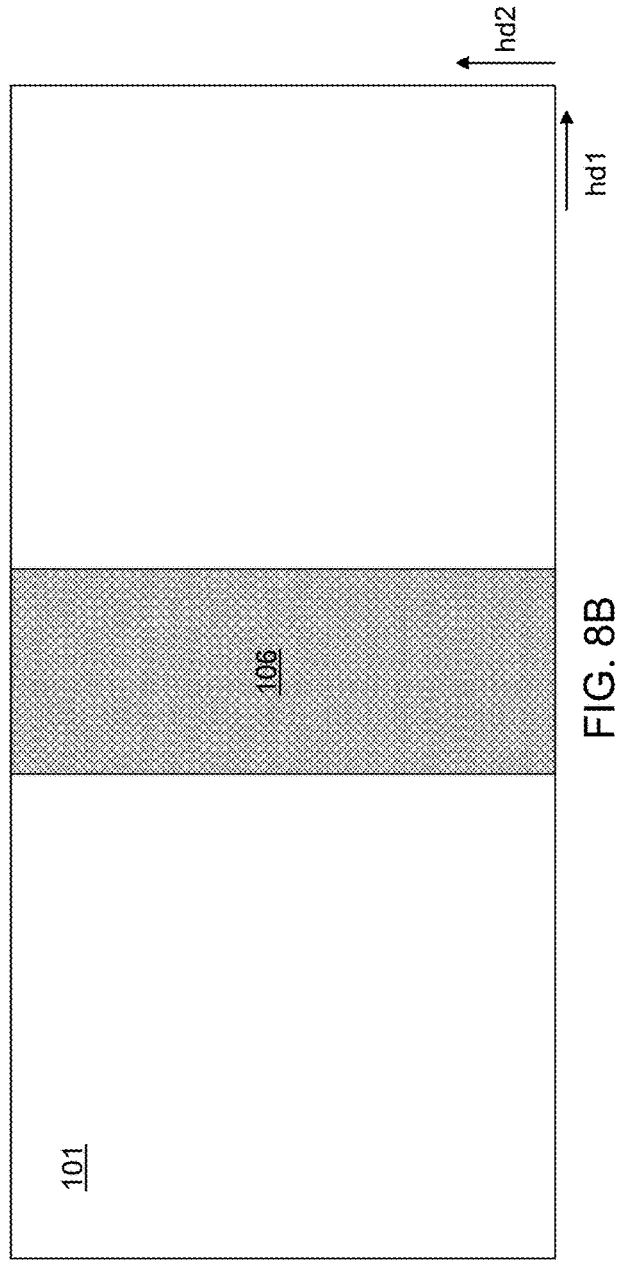
FIG. 8B is a top view of the exemplary intermediate structure of FIG. 8A.

FIG. 8A is a vertical cross-section view of an exemplary intermediate structure during a process of forming a PCM switch illustrating a dielectric capping layer 106 over the heater pad 104 according to an embodiment of the present disclosure. FIG. 8B is a top view of the exemplary intermediate structure of FIG. 8A. Referring to FIGS. 8A and 8B, a planarization process, such as a chemical mechanical planarization (CMP) process may be used to remove portions of the continuous dielectric capping layer 106L from over the upper surface 102 of the first dielectric material layer 101 and provide a discrete dielectric capping layer 106. The dielectric capping layer 106 may have a strip-shape and may extend in a horizontal direction (i.e., hd2 in FIG. 8B) over the upper surface 105 of the heater pad 104. The first dielectric material layer 101 may surround the dielectric capping layer 106 along lateral side surfaces 133a, 133b of the first dielectric material layer 101. The upper surface 107 of the dielectric capping layer 106 may be coplanar with the upper surface 102 of the first dielectric material layer 101.

Referring again to FIGS. 8A and 8B, the dielectric capping layer 106 may be laterally confined along a first horizontal direction hd1 such that side surface 133a of the second dielectric material layer 106 and side surface 131a of the underlying heater pad 104 may form a first continuous surface 135a extending along a second horizontal direction hd2, and side surface 133b of the second dielectric material layer 106 and side surface 131b of the underlying heater pad 104 may form a second continuous surface 135b extending along the second horizontal direction hd2. The first continuous surface 135a and the second continuous surface 135b may each contact the first dielectric material layer 101. In the embodiment shown in FIGS. 8A and 8B, the first continuous surface 135a and the second continuous surface 135b are each vertical surfaces, although it will be understood that the first continuous surface 135a and the second continuous surface 135b may be angled or curved surfaces that conform to the shape of the trench 103 (see FIG. 3) previously formed in the first dielectric material layer 101.

Figure 9:
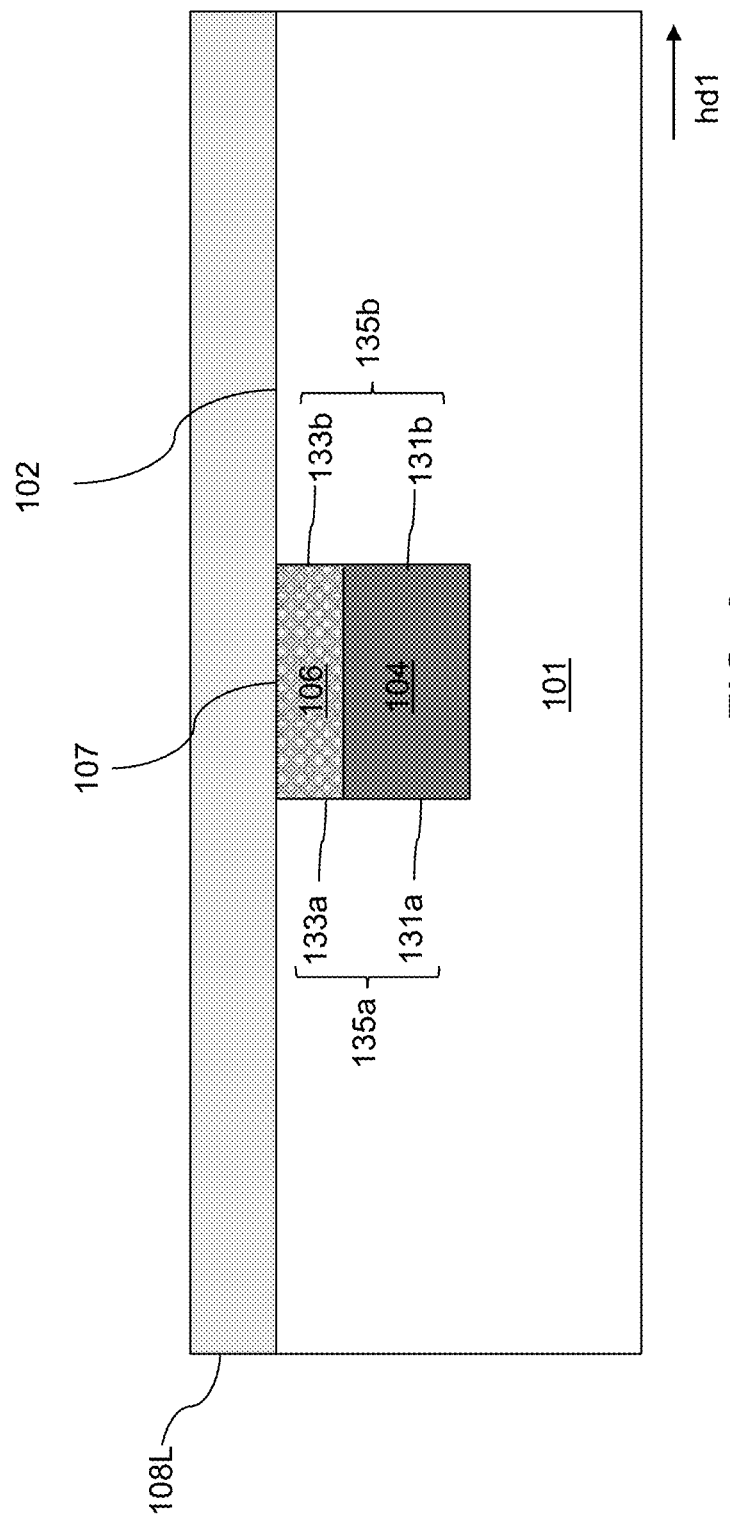
FIG. 9 is a vertical cross-section view of an exemplary intermediate structure during a process of forming a PCM switch showing a continuous phase change material (PCM) layer formed over the upper surface of the first dielectric material layer and over the upper surface of the second dielectric material layer according to an embodiment of the present disclosure.

FIG. 9 is a vertical cross-section view of an exemplary intermediate structure during a process of forming a PCM switch showing a continuous phase change material (PCM) layer 108L formed over the upper surface 102 of the first dielectric material layer 101 and over the upper surface 107 of the second dielectric material layer 106 according to an embodiment of the present disclosure. Referring to FIG. 9, the continuous PCM layer 108L may be deposited over the upper surface of the first dielectric material layer 101 and over the upper surface 107 of the dielectric capping layer 106 using a suitable deposition process as described above. The continuous PCM layer 108L may include a suitable phase change material having at least two different phases providing different resistivity, such as a high resistivity amorphous phase and a low resistivity crystalline phase. Suitable phase change materials for the continuous PCM layer 108L may include, without limitation, germanium telluride compounds, antimony telluride compounds, germanium antimony telluride (GST) compounds such as $Ge_2Sb_2Te_5$ or $GeSb_2Te_4$, germanium antimony compounds, indium germanium telluride compounds, aluminum selenium telluride compounds, indium selenium telluride compounds, and/or aluminum indium selenium telluride compounds. In some embodiments, the phase change material may be doped using a suitable dopant, such as indium or antimony, or the phase change material may be undoped. Other suitable materials for the continuous PCM layer 108L are within the contemplated scope of disclosure.

FIG. 10A is a vertical cross-section view of an exemplary intermediate structure during a process of forming a PCM switch illustrating a patterned mask 110 over the continuous PCM layer 108L according to an embodiment of the present disclosure. FIG. 10B is a top view of the exemplary intermediate structure of FIG. 10A. Referring to FIGS. 10A and 10B, the patterned mask 110 may be formed by depositing a layer of photoresist over the upper surface 109 of the continuous PCM layer 108L, and lithographically patterning the photoresist to provide the patterned mask 110. The patterned mask 110 may cover a portion of the continuous PCM layer 108L overlying the dielectric capping layer 106 and the heater pad 104. The portion of the patterned mask 110 overlying the dielectric capping layer 106 and the heater pad 104 may have a greater lateral dimension along a first horizontal direction hd1 than the dielectric capping layer 106 and the heater pad 104 along a first horizontal direction hd1, and may have a lesser lateral dimension than the dielectric capping layer 106 and the heater pad 104 along a second horizontal direction hd2 that is perpendicular to the first horizontal direction hd1.

Figure 11A:
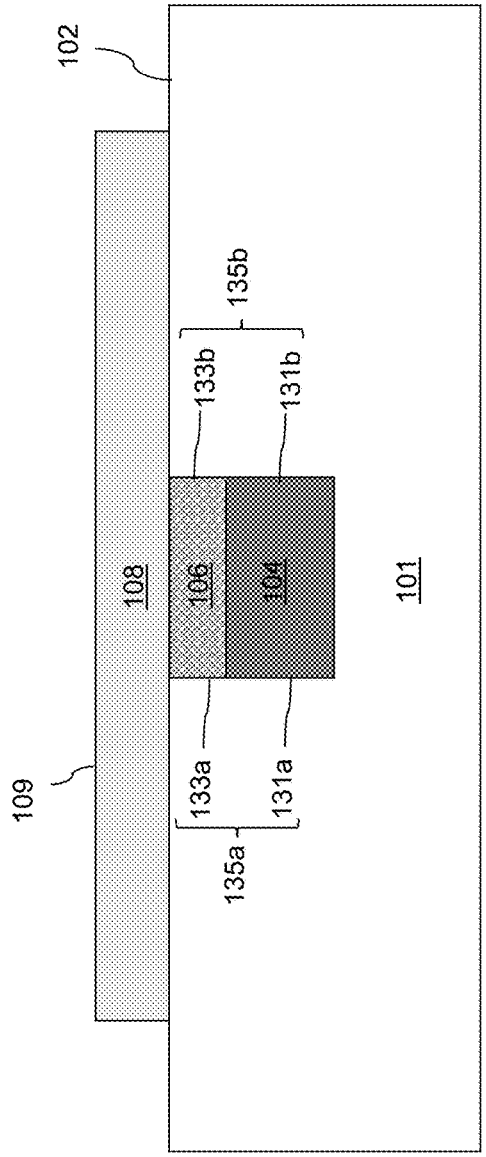
FIG. 11A is a vertical cross-section view of an exemplary intermediate structure during a process of forming a PCM switch illustrating a discrete PCM layer over the upper surface of the first dielectric material layer and the upper surface of the dielectric capping layer according to an embodiment of the present disclosure.
Figure 11B:
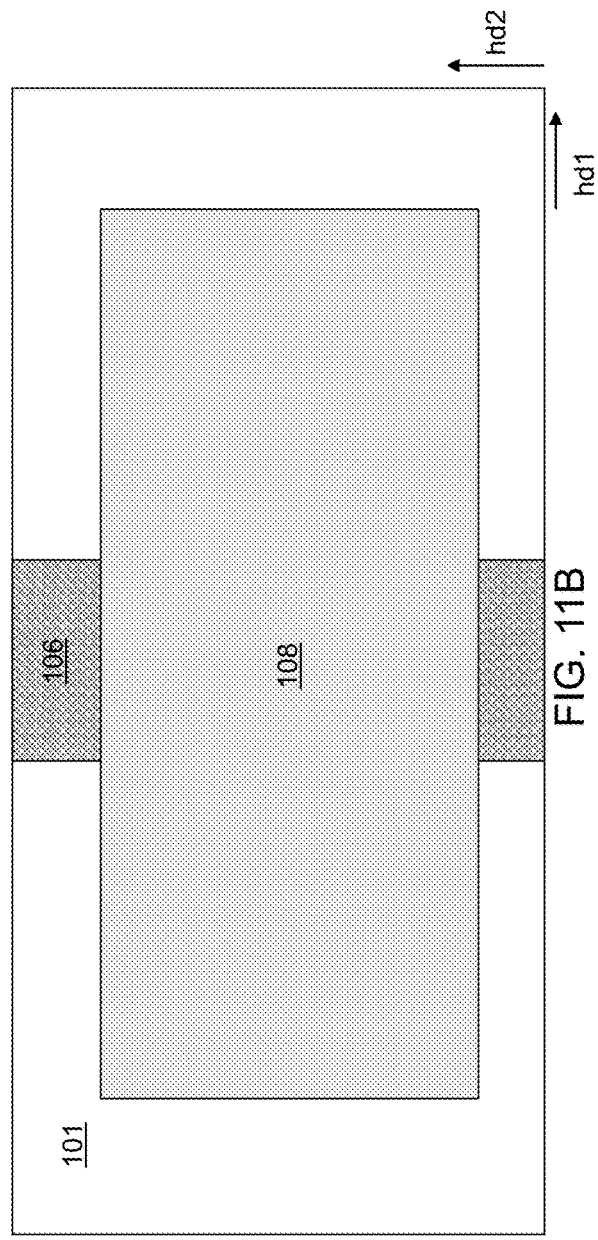
FIG. 11B is a top view of the exemplary intermediate structure of FIG. 11A.

FIG. 11A is a vertical cross-section view of an exemplary intermediate structure during a process of forming a PCM switch illustrating a discrete PCM layer 108 over the upper surface 102 of the first dielectric material layer 101 and the upper surface 107 of the dielectric capping layer 106 according to an embodiment of the present disclosure. FIG. 11B is a top view of the exemplary intermediate structure of FIG. 11A. Referring to FIGS. 11A and 11B, an etching process, such as an anisotropic etching process, may be performed to remove portions of the continuous PCM layer 108L that are exposed through the patterned mask 110 and provide a discrete PCM layer 108 over the upper surface 102 of the first dielectric material layer 101 and the upper surface 107 of the dielectric capping layer 106. The etching process may expose the upper surface 102 of the first dielectric material layer 101 and the upper surface 107 of the dielectric capping layer 106 surrounding the PCM layer 108. In various embodiments, the PCM layer 108 may have a greater lateral dimension along the first horizontal direction hd1 than the dielectric capping layer 106 and the heater pad 104, and may have a lesser lateral dimension than the dielectric capping layer 106 and the heater pad 104 along the second horizontal direction hd2. Following the etching process, the patterned mask 110 may be removed using a suitable process, such as via ashing or dissolution using a solvent.

Figure 12:
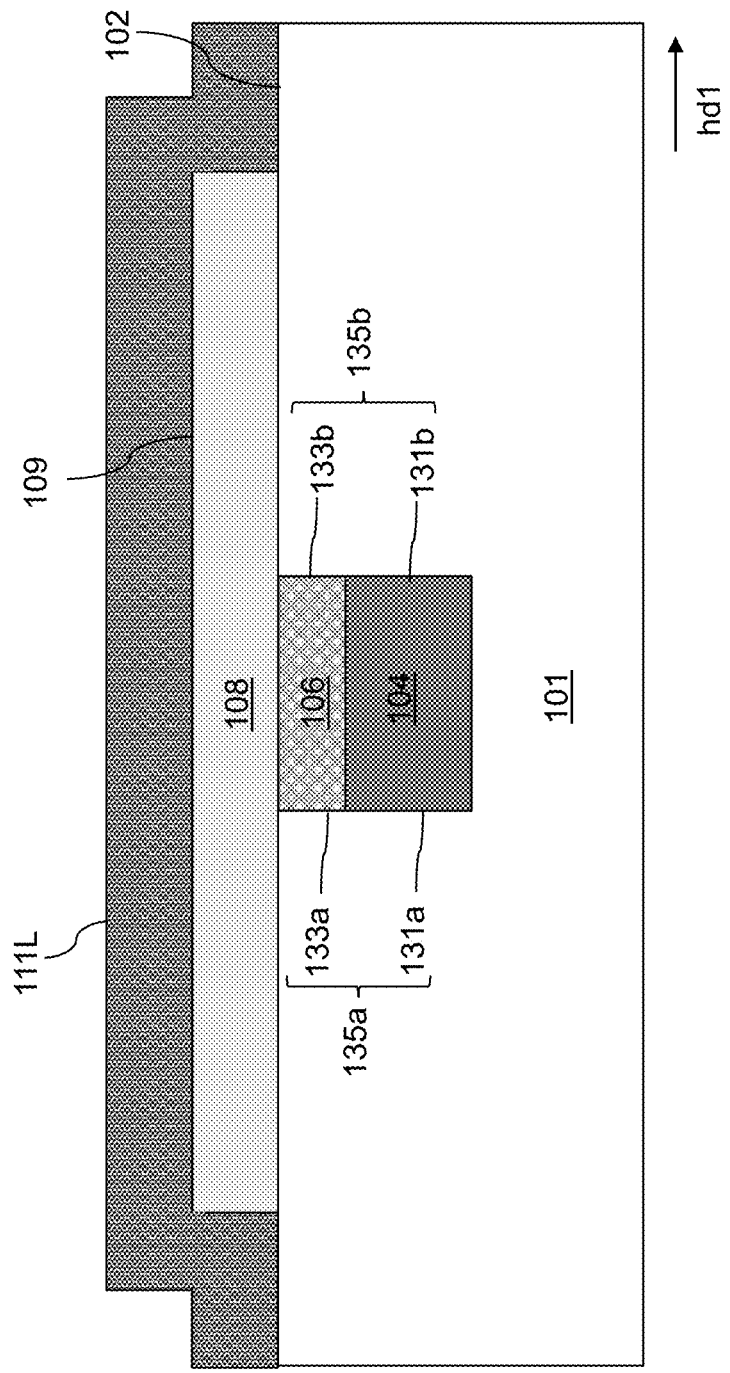
FIG. 12 is a vertical cross-section view of an exemplary intermediate structure during a process of forming a PCM switch illustrating a continuous electrode layer over the upper surface of the first dielectric material layer and the upper surface of the dielectric capping layer and over the upper surface and the side surfaces of the PCM layer according to an embodiment of the present disclosure.

FIG. 12 is a vertical cross-section view of an exemplary intermediate structure during a process of forming a PCM switch illustrating a continuous electrode layer 111L over the upper surface 102 of the first dielectric material layer 101 and the upper surface 107 of the dielectric capping layer 106 and over the upper surface 109 and the side surfaces of the PCM layer 108 according to an embodiment of the present disclosure. Referring to FIG. 12, the continuous electrode layer 111L may be formed by depositing an electrically conductive material over the exposed upper surfaces of the first dielectric material layer 101 and the dielectric capping layer 106 and over the upper surface and side surfaces of the PCM layer 108. The continuous electrode layer 111L may include a metallic material having relatively low electrical resistivity, such as tungsten, tungsten nitride, nickel silicide, and/or aluminum. Other suitable materials for the continuous electrode layer 111L are within the contemplated scope of disclosure. The continuous electrode layer 111L may be deposited using a suitable deposition process as described above.

FIG. 13A is a vertical cross-section view of an exemplary intermediate structure during a process of forming a PCM switch illustrating a patterned mask 112 over the continuous electrode layer 111L according to an embodiment of the present disclosure. FIG. 13B is a top view of the exemplary intermediate structure of FIG. 13A. Referring to FIGS. 13A and 13B, the patterned mask 112 may be formed by depositing a layer of photoresist over the continuous electrode layer 111L, and lithographically patterning the photoresist to provide the patterned mask 112. The patterned mask 112 may expose a region of the continuous electrode layer 111L that overlies the heater pad 104 and the dielectric capping layer 106 and may cover portions of the continuous electrode layer 111L that overlie peripheral regions of the PCM layer 108 on opposite sides of the PCM layer 108.

Figure 14A:
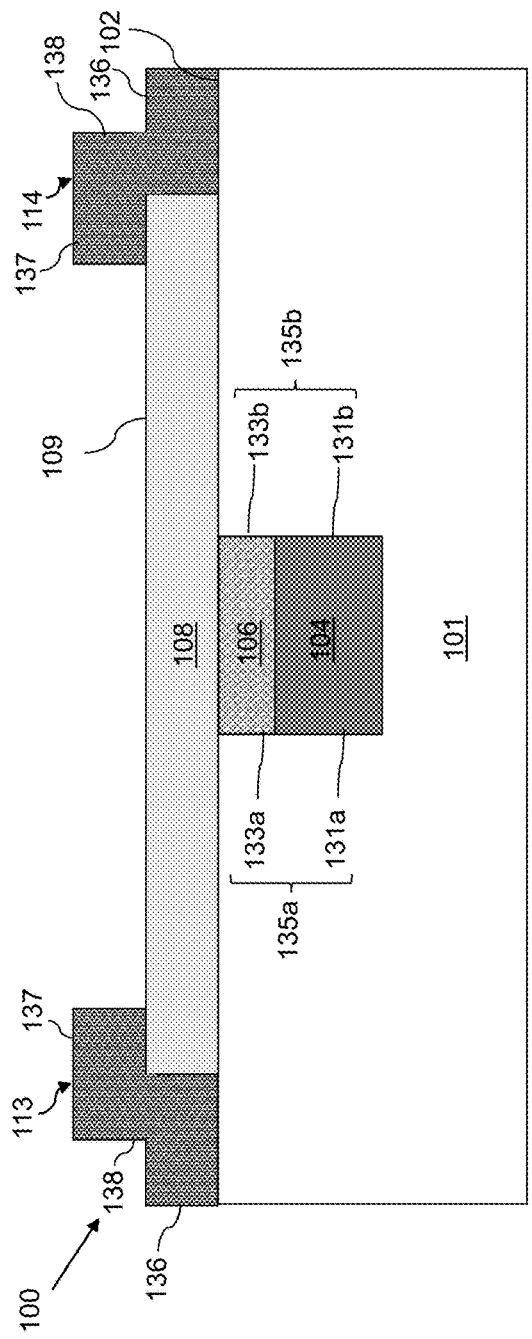
FIG. 14A is a vertical cross-section view of a PCM switch including first and second electrodes and over the upper surface of the first dielectric material layer and the upper surface and side surfaces of the PCM layer.
Figure 14B:
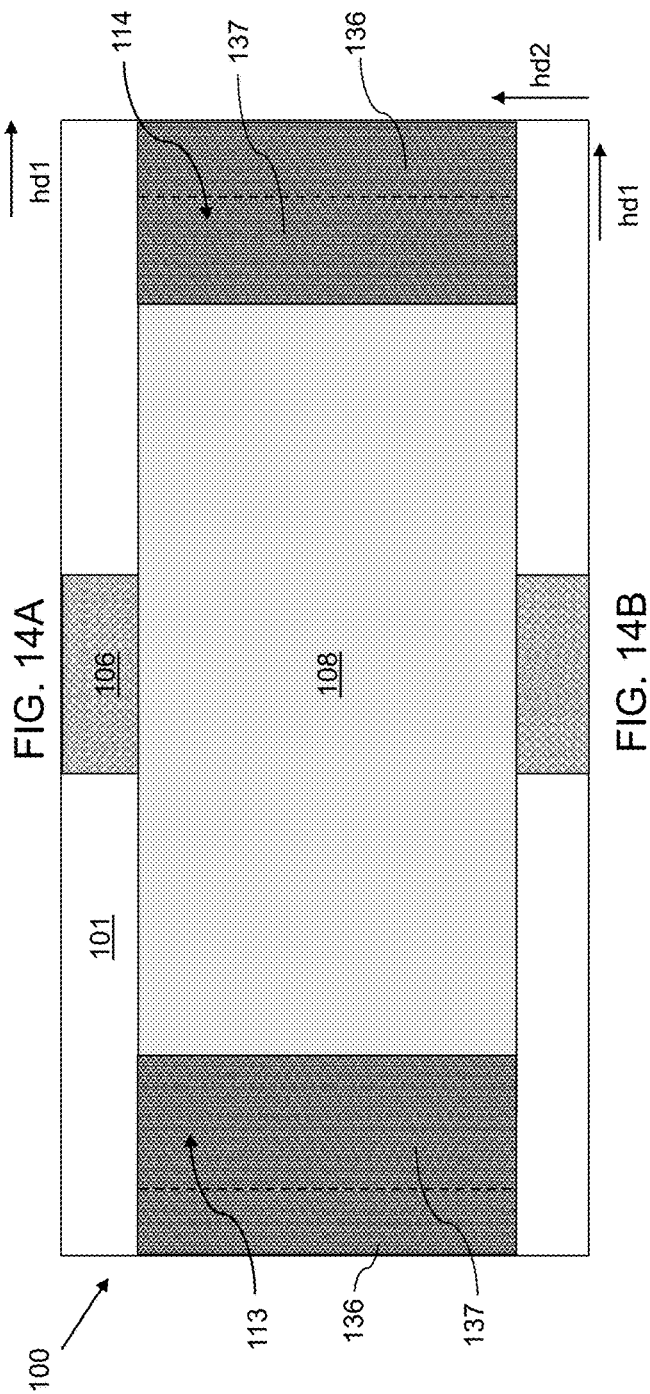
FIG. 14B is a top view of the PCM switch 100 of FIG. 14A.

FIG. 14A is a vertical cross-section view of a PCM switch 100 including first and second electrodes 113 and 114 over the upper surface 102 of the first dielectric material layer 101 and the upper surface 109 and side surfaces of the PCM layer 108. FIG. 14B is a top view of the PCM switch 100 of FIG. 14A. Referring to FIGS. 14A and 14B, an etching process, such as an anisotropic etching process, may be performed to remove portions of the continuous electrode layer 111L that are exposed through the patterned mask 112 and provide discrete first and second electrodes 113 and 114 over the upper surface 102 of the first dielectric material layer 101 and the upper surface 109 and side surfaces of the PCM layer 108. The etching process may expose a portion of the upper surface 109 of the PCM layer 108 between the first and second electrodes 113 and 114, and the upper surface 102 of the first dielectric material layer 101 and the upper surface 107 of the dielectric capping layer 106 surrounding the PCM layer 108 and the first and second electrodes 113 and 114.

Referring again to FIGS. 14A and 14B, the first and second electrodes 113 and 114 of the PCM switch 100 may each include a first horizontal portion 136 extending over the upper surface 102 of the first dielectric material layer 101, a second horizontal portion 137 extending over the upper surface 109 of the PCM layer 108, and a vertical portion 138 extending over a side surface of the PCM layer 108 between the first horizontal portion 136 and the second horizontal portion 137.

Figure 15A:
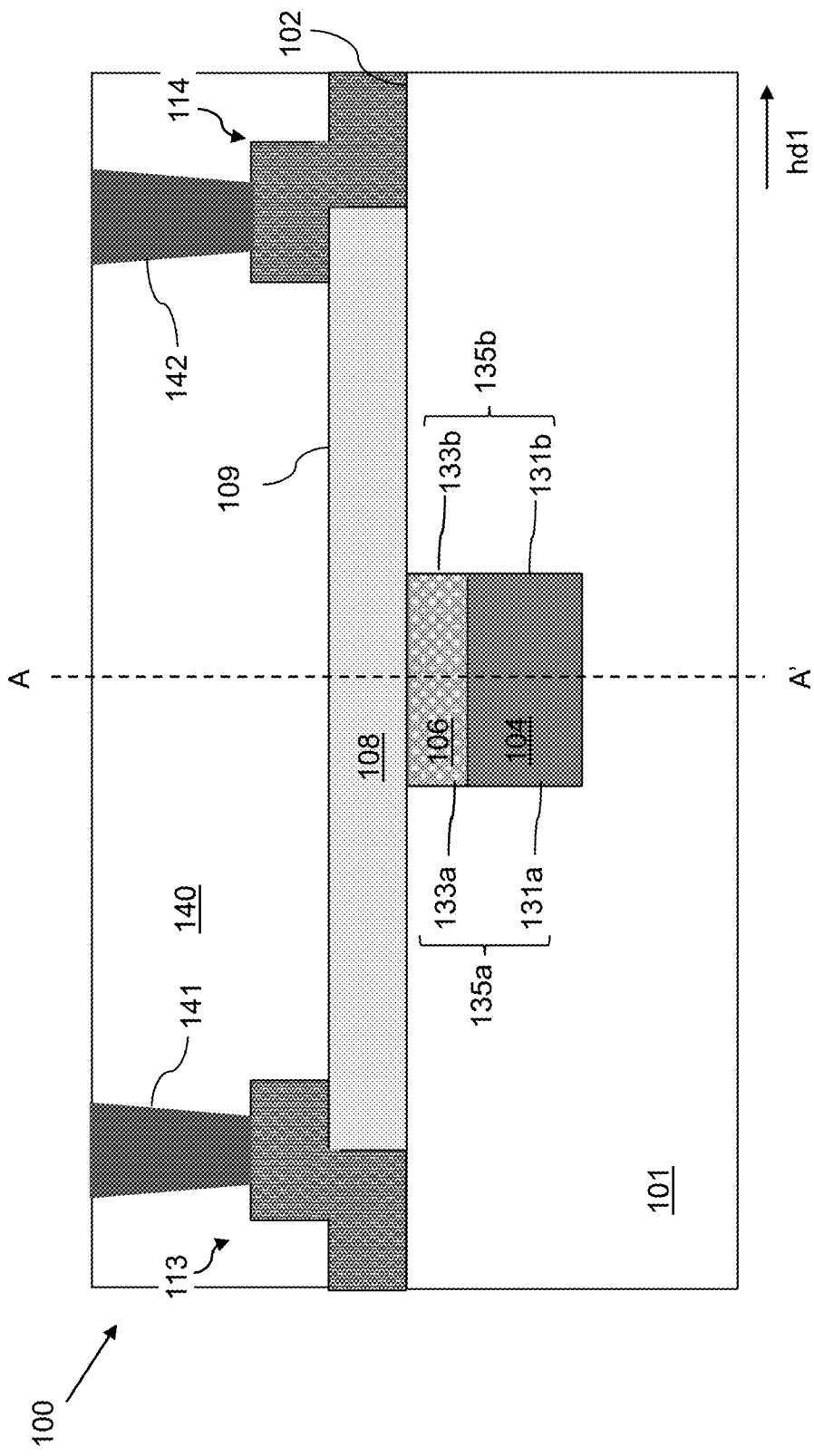
FIG. 15A is a vertical cross-section view of the PCM switch illustrating electrical contacts contacting the first and second electrodes the PCM switch according to an embodiment of the present disclosure.
Figure 15B:
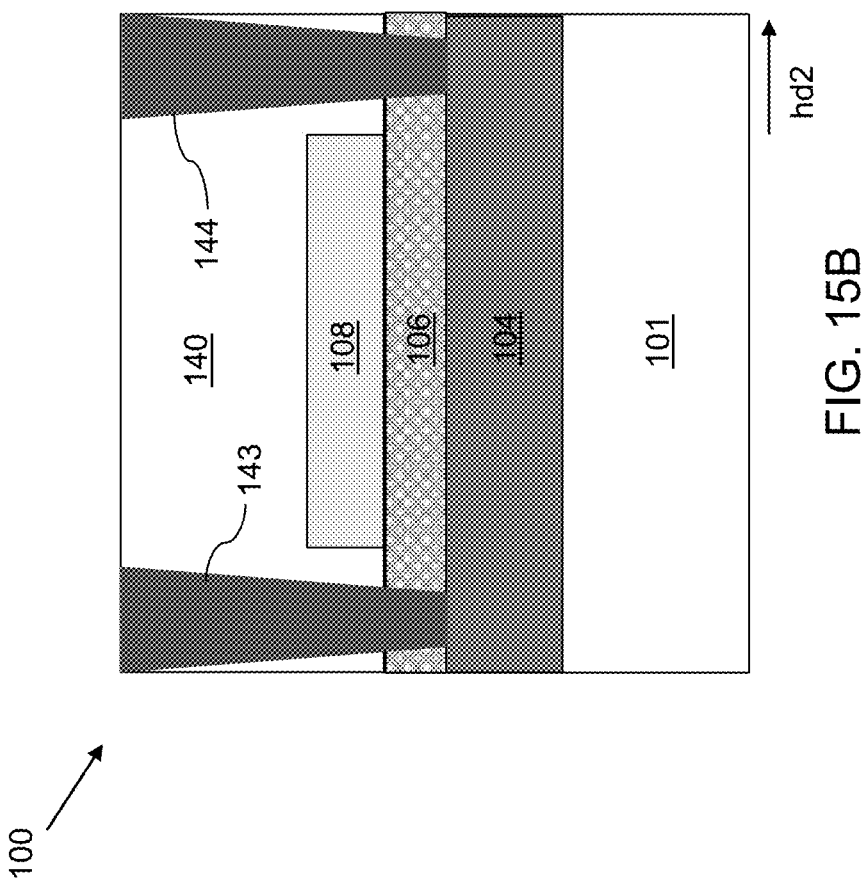
FIG. 15B is a vertical cross-section view of the PCM switch along plane A-A' in FIG. 15A illustrating electrical contacts contacting the heater pad of the PCM switch on opposite sides of the PCM layer according to an embodiment of the present disclosure.

FIG. 15A is a vertical cross-section view of the PCM switch 100 illustrating electrical contacts 141 and 142 contacting the first and second electrodes 113 and 114 of the PCM switch 100 according to an embodiment of the present disclosure. FIG. is a vertical cross-section view of the PCM switch 100 along plane A-A' in FIG. illustrating electrical contacts 143 and 144 contacting the heater pad 104 of the PCM switch 100 on opposite sides of the PCM layer 108 according to an embodiment of the present disclosure. Referring to FIGS. 15A and 15B, a second dielectric material layer 140 may be deposited over the first and second electrodes 113 and 114 and the PCM layer 108 of the PCM switch 100 and over the exposed upper surfaces 102 and 107 of the first dielectric material layer 101 and the dielectric capping layer 106. The second dielectric material layer 140 may include a suitable dielectric material, such as silicon oxide, undoped silicate glass, a doped silicate glass, organosilicate glass, amorphous fluorinated carbon, porous variants thereof, or combinations thereof. Other suitable dielectric materials are within the contemplated scope of disclosure. In some embodiments, the second dielectric material layer 140 may be composed of the same material as the first dielectric material layer 101. Alternatively, the second dielectric material layer 140 may have a different composition than the first dielectric material layer 101. The second dielectric material layer 140 may be deposited using a suitable deposition method as described above.

Referring to FIG. 15A, the electrical contacts 141 and 142 to the first electrode 113 and the second electrode 114 may be formed by selectively etching the second dielectric material layer 140 through a photolithographically-patterned mask to form a pair of via openings extending through the second dielectric material layer 140 and exposing the first electrode 113 and the second electrode 114 at the bottom of the respective via openings. One or more metallic materials (e.g., a metallic liner layer and a metallic fill material) as described above may be deposited over the upper surface of the second dielectric material layer 140 and within the via openings. The metallic material(s) may be deposited using a suitable deposition process as described above. A planarization process, such as a chemical mechanical planarization (CMP) process, may be used to remove excess metallic material(s) from over the upper surface of the second dielectric material layer 140 to form discrete electrical contacts 141 and 142 (e.g., conductive vias) contacting the first electrode 113 and the second electrode 114 as shown in FIG. 15A.

Referring to FIG. 15B, the electrical contacts 143 and 144 to the heater pad 104 may be formed by performing an etching process through a photolithographically-patterned mask to form a pair of via openings extending through the second dielectric material layer 140 and the dielectric capping layer 106 and exposing the heater pad 104 at the bottom of the respective via openings. One or more metallic materials (e.g., a metallic liner layer and a metallic fill material) as described above may be deposited over the upper surface of the second dielectric material layer 140 and within the via openings. The metallic material(s) may be deposited using a suitable deposition process as described above. A planarization process, such as a chemical mechanical planarization (CMP) process, may be used to remove excess metallic material(s) from over the upper surface of the second dielectric material layer 140 to form discrete electrical contacts 143 and 144 (e.g., conductive vias) contacting the heater pad 104 on opposite sides of the PCM layer 108 as shown in FIG. 15B. In some embodiments, the electrical contacts 143 and 143 to the heater pad 104 may be formed at the same time as the electrical contacts 141 and 142 to the first and second electrodes 113 and 114 using the same etching, metallic material deposition, and planarization processes. Alternatively, the electrical contacts 143 and 144 to the heater pad 104 may be formed using separate etching, deposition and/or planarization processes than are used to form the electrical contacts 141 and 142 to the first and second electrodes 113 and 114.

In some embodiments, one or both of the electrical contacts 141 and 142 to the first and second electrodes 113 and 114 may be formed within the underlying first dielectric material layer 101 (e.g., prior to forming the first and second electrical contacts 113 and 114), such that the electrical contacts 141 and/or 142 contact the bottom surface of the respective first electrode 113 and/or second electrode 114. Similarly, in some embodiments, one or both of the electrical contacts 143 and 144 to the heater pad 104 may be formed within the underlying first dielectric material layer 101 (e.g., prior to forming the heater pad 104), such that the electrical contacts 143 and/or 144 contact the bottom surface heater pad 104.

Figure 16:
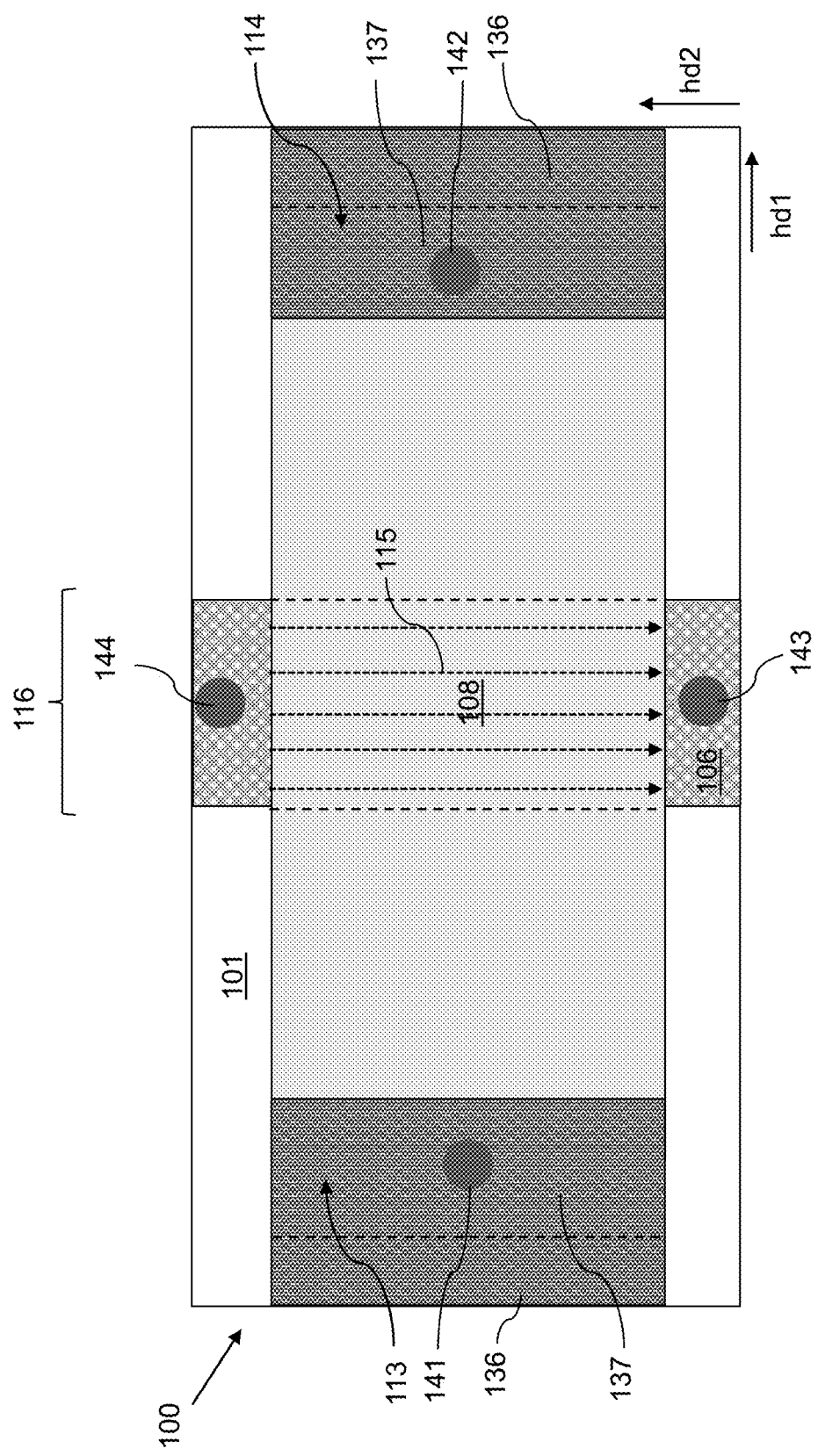
FIG. 16 is a top view of a PCM switch schematically illustrating a process of switching the PCM switch between different resistivity states according to an embodiment of the present disclosure.

FIG. 16 is a top view of a PCM switch 100 schematically illustrating a process of switching the PCM switch 100 between different resistivity states according to an embodiment of the present disclosure. Referring to FIG. 16, a bias voltage may be selectively applied across the heater pad 104 via electrical contacts 143 and 144. The application of the bias voltage across the heater pad 104 may induce a current to flow through the heater pad 104 and beneath the PCM layer 108, as schematically indicated by arrows 115 in FIG. 16. The current flow through the heater pad 104 causes the heating pad to heat up via resistive heating. A portion of the thermal energy generated in the heater pad 104 may be transferred through the dielectric capping layer 106 to heat the PCM layer 108.

By controlling the characteristics of the current pulse flowing through the heater pad 104, the thermal profile within a portion 116 of the PCM layer 108 overlying the heater pad 104 (which may also be referred to as the "active region" 116 of the PCM layer 108) may be controlled. In particular, a current pulse having a relatively short pulse width and rapid pulse falling time may quickly heat the active region 116 of the PCM layer 108 above its melting temperature ($T_{melt}$), causing the active region 116 of the PCM layer 108 to transition from a low-resistivity state to a high-resistivity state, while the rapid falling time of the current pulse may cause the active region 116 of the PCM layer 108 to rapidly quench and avoid recrystallization as it cools. Thus, the active region 116 of the PCM layer 108 may retain its high resistivity state indefinitely following the application of the current pulse.

In contrast, a current pulse having a relatively longer pulse width and longer falling time may heat the active region 116 of the PCM layer 108 to a temperature above its crystallization temperature ($T_{crys}$), but below its melting temperature ($T_{melt}$), causing the active region 116 of the PCM layer 108 to undergo crystal nucleation, while the long falling time of the current pulse may promote crystal growth in the active region 116 of the PCM layer 108 as it gradually cools, thereby causing the active region 116 of the PCM layer 108 to transition from a high-resistivity state to a low-resistivity state. The active region 116 of the PCM layer 108 may retain this low resistivity state indefinitely until the application of a subsequent current pulse that is configured to transition the active region 116 to a high-resistivity state.

In some embodiments, the electrical contacts 143 and 144 to the heater pad 104 may be electrically coupled to control circuitry configured to selectively control the application of current pulses through the heater pad 104 and thereby control (i.e., program) the resistance state of the active region 116 of the PCM layer 108. For example, one or both of the electrical contacts 143 and 144 may be coupled to one or more transistors 701 via metal interconnect structures (612, 618, 622, 628, 631, 638, 642, 648) as shown in FIG. 1.

Figure 17:
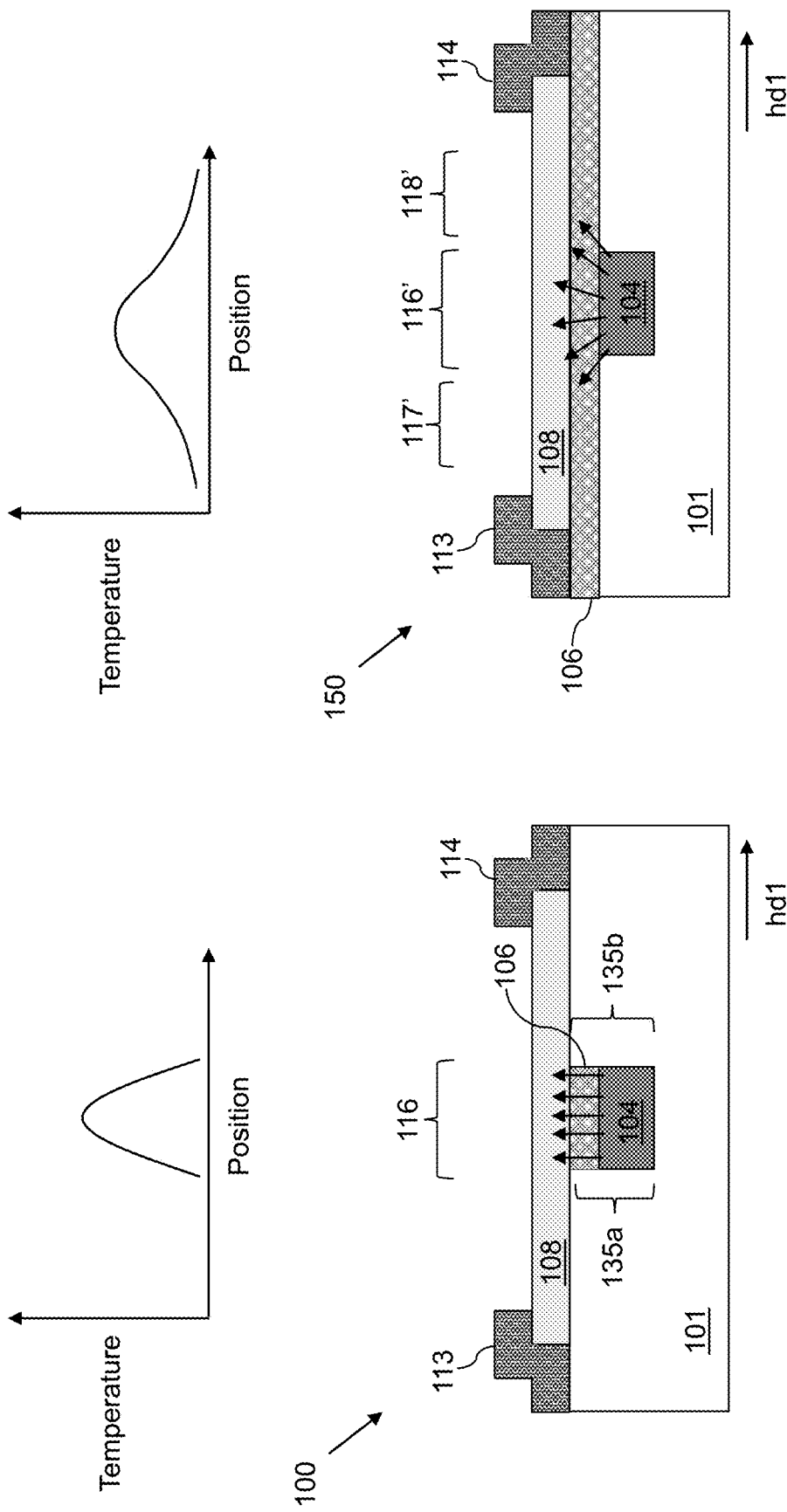
FIG. 17A is a vertical cross-section view of a PCM switch in which the dielectric capping layer and the heater pad form continuous side surfaces according to an embodiment of the present disclosure.
FIG. 17B is a vertical cross-section view of a comparative PCM switch in which the dielectric capping layer and the heater pad do not form continuous side surfaces.

A PCM switch 100 in accordance with various embodiments may provide improved thermal confinement within the PCM layer 108 in comparison to other related PCM switches. In particular, by utilizing a dielectric capping layer 106 between the heater pad 104 and the PCM layer 108 that is laterally confined such that the sides of the dielectric capping layer 106 and the heater pad 104 form continuous side surfaces 135a and 135b extending along the direction of current flow within the heater pad 104, the heating of the PCM layer 108 may be confined to a relatively narrow strip of the PCM layer 108 overlying the heater pad 104. This is schematically illustrated in FIGS. 17A and 17B, which are vertical cross-section views of a PCM switch 100 according to an embodiment of the present disclosure (FIG. 17A) and a related PCM switch 150 in which the dielectric capping layer 106 and the heater pad 104 do not form a continuous side surface (FIG. 17B). In the related PCM switch 150, the dielectric capping layer 106 extends continuously beneath the PCM layer 108 and the first electrode 113 and second electrode 114. In contrast, in the embodiment PCM switch 100 shown in FIG. 17A, the heat transfer from the heater pad 104 through the dielectric capping layer 106 to the PCM layer 108 (schematically indicated by arrows) occurs predominantly along a vertical direction. In some embodiments, the first dielectric material layer 101 that laterally surrounds the heater pad 104 and the dielectric capping layer 106 may be less thermally conductive than the dielectric capping layer 106. Thus, heat transfer from the heater pad 104 occurs primarily vertically upwards through the dielectric capping layer 106 to the PCM layer 108. The heating of the PCM layer 108 may be nearly exclusively confined to the region of the PCM layer 108 located vertically above the heater pad 104, and there is minimal thermal dissipation along a lateral direction. This results in a relatively high peak temperature within the active region 116 of the embodiment PCM switch 100 and little to no heating of the PCM layer 108 outside of the active region 116, as illustrated by the plot of temperature vs. position in FIG. 17A.

In the related PCM switch 150 shown in FIG. 17B, there may be a significantly greater amount of lateral heat dissipation within the dielectric capping layer 106 (schematically indicated by arrows) which extends continuously beneath the PCM layer 108. This results in a lower peak temperature within the active region 116' of the PCM layer 108 and a significant amount of heating outside of the active region 116' of the PCM layer 108, as indicated by the plot of temperature vs. position in FIG. 17B.

The high thermal confinement within the active region 116 of the PCM switch 100 according to various embodiments of the present disclosure may enable the utilization of a lower bias voltage across the heater pad 134 as compared to the bias voltage required for a comparative PCM switch 150. In some embodiments, the bias voltage may be reduced by 5-10% or more compared to existing PCM switches. This may provide a more efficient PCM switch 150 with reduced power consumption.

The high thermal confinement within the active region 116 of the PCM switch 100 according to various embodiments of the present disclosure may also minimize the possibility that portions of the PCM layer 108 outside of the active region 116 may be heated sufficiently to become "soft programmed" to an intermediate resistivity state. Referring again to FIG. 17B, the wider thermal distribution in the comparative related PCM switch 150 increases the likelihood that regions 117' and 118' of the PCM layer 108 located outside of the active region 116' may be inadvertently programmed into an intermediate resistivity state that is between the low resistivity (i.e., "On") state and the high resistivity (i.e., "Off") state of the PCM switch 150, thereby degrading the reliability and the accuracy of the related PCM switch 150. In contrast, the high thermal confinement of a PCM switch 100 in accordance with various embodiments may eliminate unwanted intermediate resistance states in the signal path across the PCM layer 108, which may help to reduce the $R_{ON}$ and insertion loss characteristics of the embodiment PCM switch 100 and provide an embodiment PCM switch 100 with improved performance.

Figure 18:
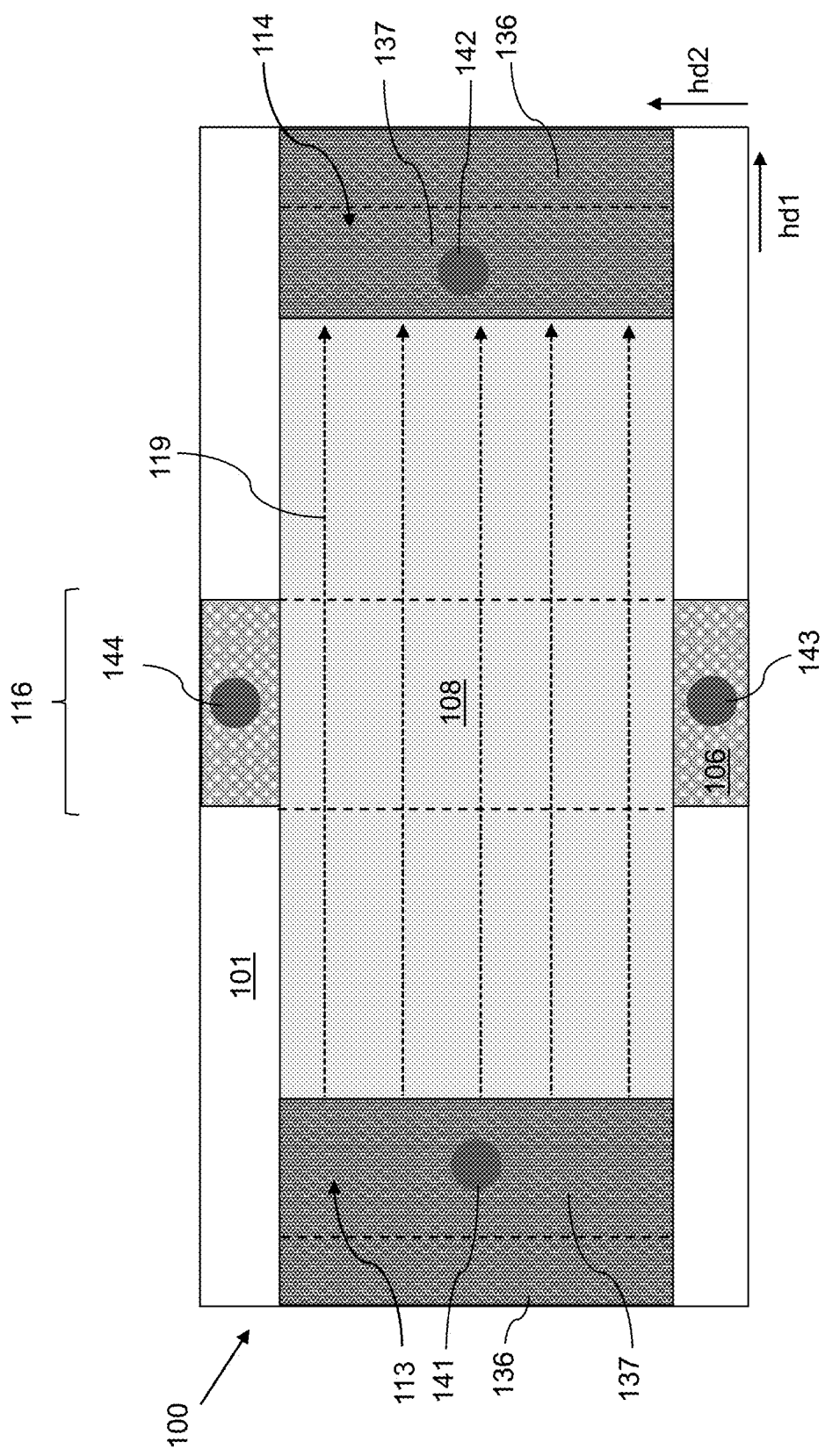
FIG. 18 is a top view of a PCM switch schematically illustrating the signal pathway across the PCM switch according to an embodiment of the present invention.

FIG. 18 is a top view of a PCM switch 100 schematically illustrating the signal pathway across the PCM switch 100 according to an embodiment of the present invention. Referring to FIG. 18, an input signal, such as a radiofrequency (RF) signal, may be transmitted to the first electrode 113 via electrical contact 141. In instances in which the active region 116 of the PCM layer 108 is in a low-resistivity state, the PCM switch 100 is "On," and the signal may be transmitted across the PCM layer 108 to the second electrode 114 and the electrical contact 142, as schematically indicated by arrows 119. In instances in which the active region 116 of the PCM layer 108 is in a high-resistivity state, the PCM switch 100 is "Off," and the signal transmission to the second electrode 114 and electrical contact 142 may be blocked.

Figure 19:
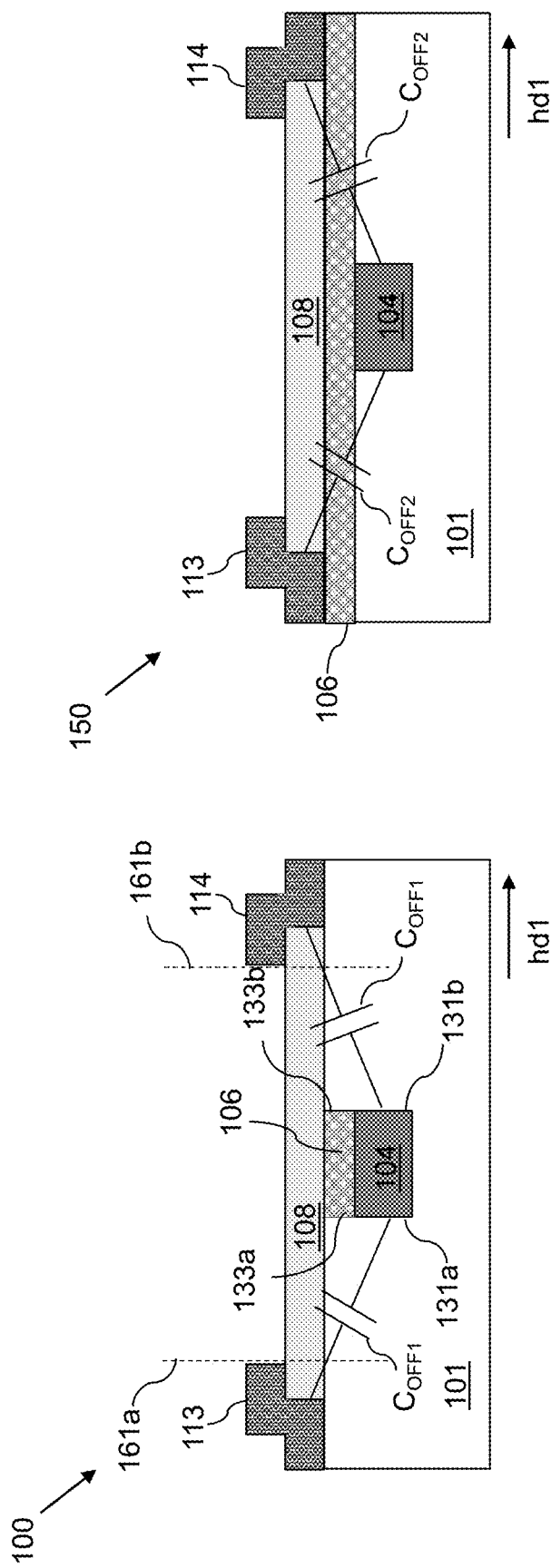
FIG. 19A is a vertical cross-section view schematically illustrating the CUFF characteristics of a PCM switch including a dielectric capping layer that is laterally confined such that the sides of the dielectric capping layer and the heater pad form continuous side surfaces extending transverse to the signal pathway across the PCM switch according to an embodiment of the present disclosure.
FIG. 19B is a vertical cross-section view of schematically illustrating the CUFF characteristics of a comparative PCM switch that includes a dielectric capping layer extending continuously beneath the phase change material layer and the first and second electrodes.

FIGS. 19A and 19B are vertical cross-section views of a PCM switch 100 according to an embodiment of the present disclosure (FIG. 19A) and a comparative related PCM switch 150 (FIG. 19B) schematically illustrating the $C_{OFF}$ characteristics of the respective PCM switches. Referring to FIGS. 19A and 19B, the embodiment PCM switch 100 shown in FIG. 19A includes a dielectric capping layer 106 that is laterally confined such that the sides of the dielectric capping layer 106 and the heater pad 104 form continuous side surfaces 135a and 135b extending transverse to the signal pathway across the PCM switch 100. In contrast, in the comparative PCM switch 150 shown in FIG. 19B, the dielectric capping layer 106 extends continuously beneath the PCM layer 108 and the first and second electrodes 113 and 114. The $C_{OFF}$ of the PCM switches 100 and 150 is the parasitic capacitance between the heater pad 104 and the first and second electrodes 113 and 114. As discussed above, high isolation is desirable for RF switch performance, and the $C_{OFF}$ is inversely related to the isolation characteristics of the PCM switch. Thus, the lower the $C_{OFF}$ value of the switch, the better the switch performance.

In the comparative embodiment of FIG. 19B, the parasitic capacitance $C_{OFF2}$ is relatively high due to the contribution of the continuous dielectric capping layer 106 that is located between the heater pad 104 and the respective first and second electrodes 113 and 114. Further, the continuous dielectric capping layer 106 is typically composed of a relatively high-k dielectric material (e.g., a material having a higher dielectric constant than the dielectric constant of the first dielectric material layer 101) to provide a high degree of electrical isolation between the heater pad 104 and the overlying PCM layer 108, which further increases the capacitance value of $C_{OFF2}$. In contrast, in the embodiment PCM switch 100 shown in FIG. 19A, the dielectric capping layer 106 is significantly narrower along the first horizontal direction hd1 and contributes significantly less to the parasitic capacitance $C_{OFF1}$ of the embodiment PCM switch 100. In various embodiments, the dielectric capping layer 106 may be laterally offset from the first and second electrodes 113 and 114 of the PCM switch 100 such that the dielectric capping layer 106 does not extend to respective vertical planes 161a and 161b containing the peripheral edges of the first and second electrodes 113 and 114 facing towards the heater pad 104. By providing a dielectric capping layer 106 that is laterally offset from the first and second electrodes 113 and 114, the parasitic capacitance $C_{OFF1}$ of the PCM switch 100 may be reduced due to a lower contribution of the dielectric capping layer 106 to the $C_{OFF1}$ of the PCM switch 100. This may provide higher isolation characteristics and improved switch performance.

Figure 20:
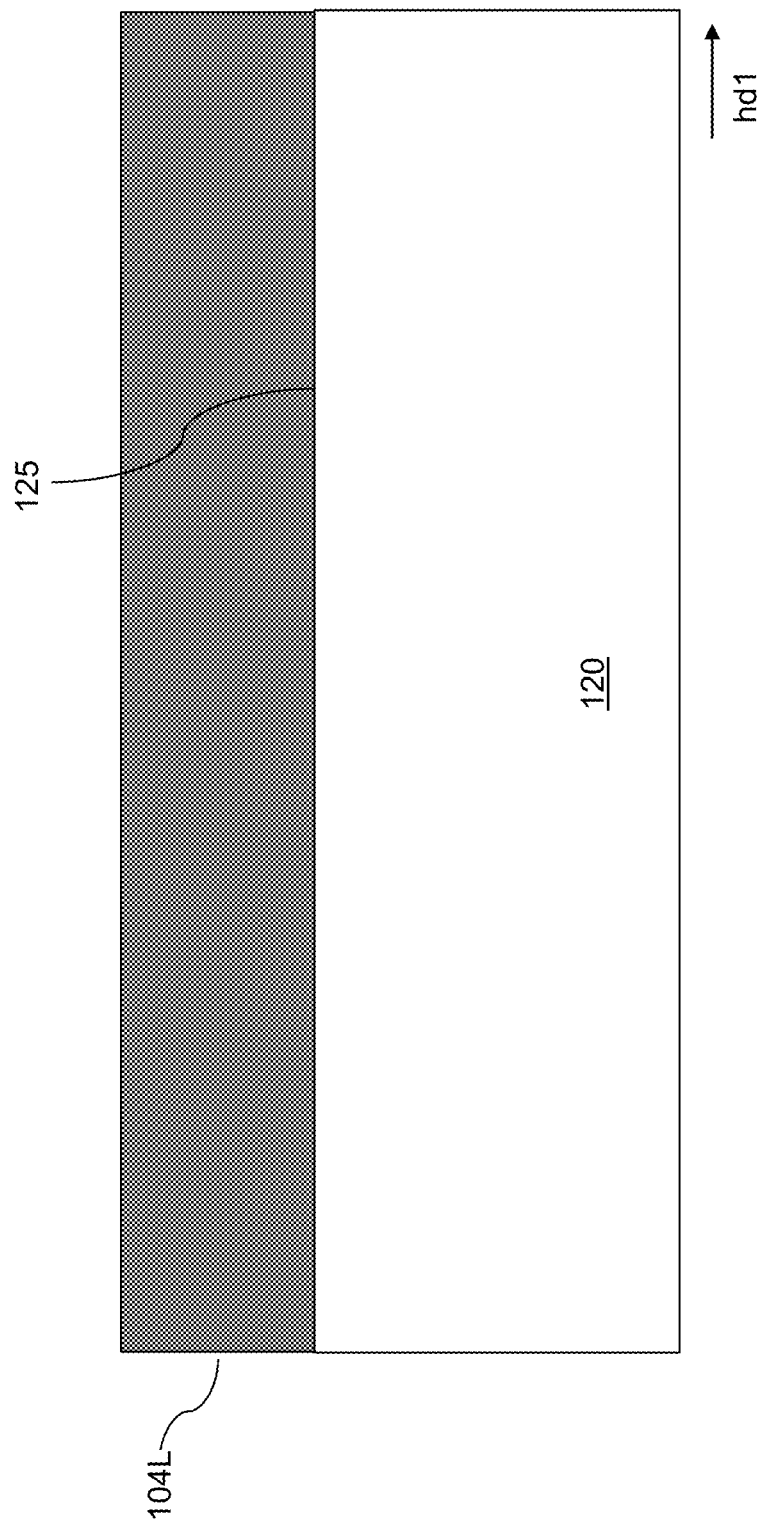
FIG. 20 is a vertical cross-section view of an exemplary intermediate structure during a process of forming a PCM switch illustrating a continuous heater material layer deposited over the upper surface of a lower dielectric material layer according to an embodiment of the present disclosure.
Figure 21:
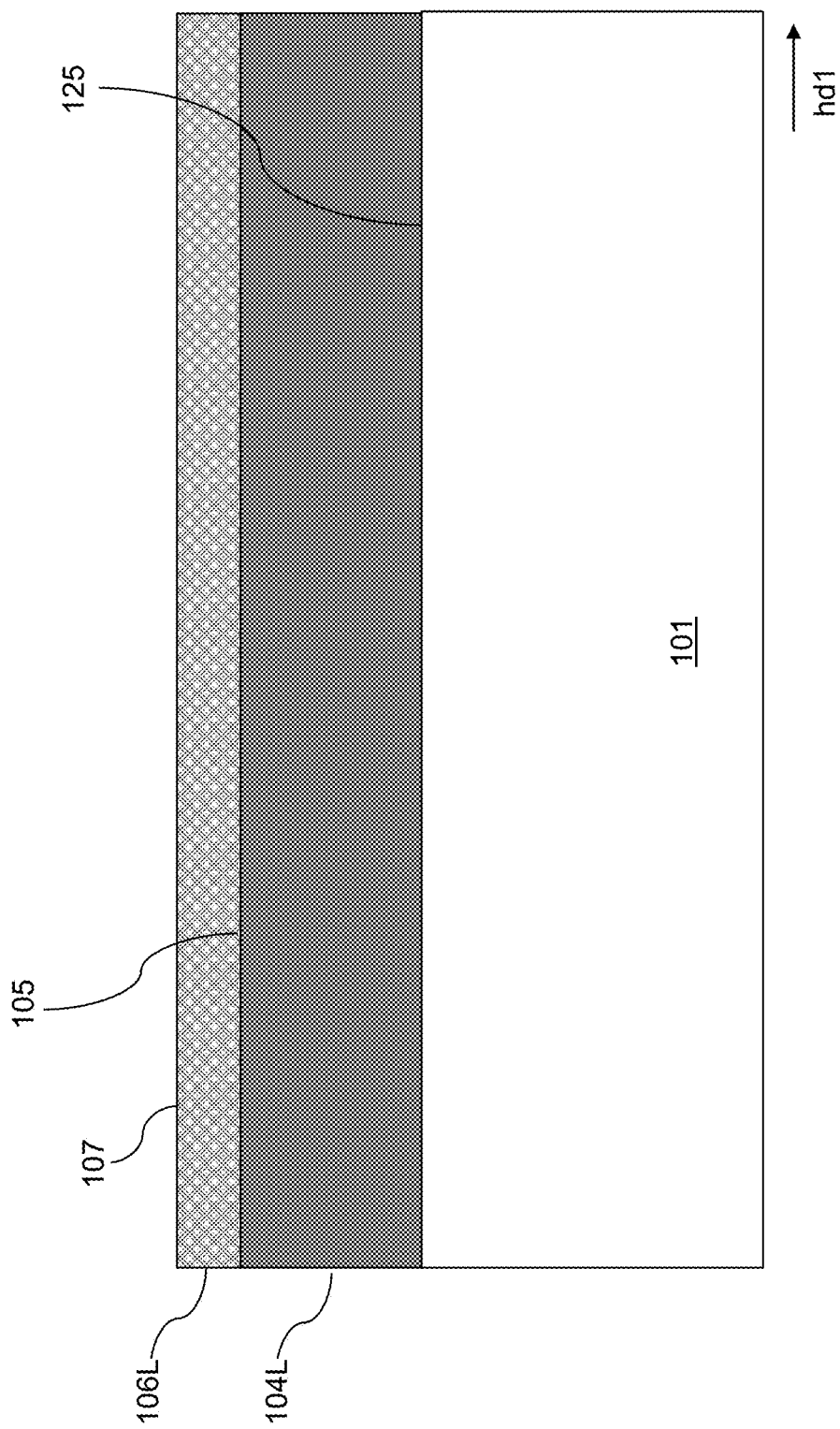
FIG. 21 is a vertical cross-section view of an exemplary intermediate structure during a process of forming a PCM switch illustrating a continuous dielectric capping layer deposited over the upper surface of the continuous heater material layer according to an embodiment of the present disclosure.

FIGS. 20-25 are sequential vertical cross-section views of an exemplary intermediate structure during a process of forming an embodiment PCM switch illustrating an alternative process for forming a heater pad 104 and a laterally-confined dielectric capping layer 106 over the heater pad 104 according to an embodiment of the present disclosure. Referring to FIG. 20, a continuous heater material layer 104L may be deposited over the upper surface 125 of a lower dielectric material layer 120. Unlike in the exemplary intermediate structure shown in FIG. 3, the continuous heater material layer 104L may be deposited over a planar upper surface 125 of the lower dielectric material layer 101 that does not include a trench in the location of a PCM switch to be subsequently formed. Referring to FIG. 21, a continuous dielectric capping layer 106L may be deposited over the upper surface 105 of the continuous heater material layer 104L.

Figure 22:
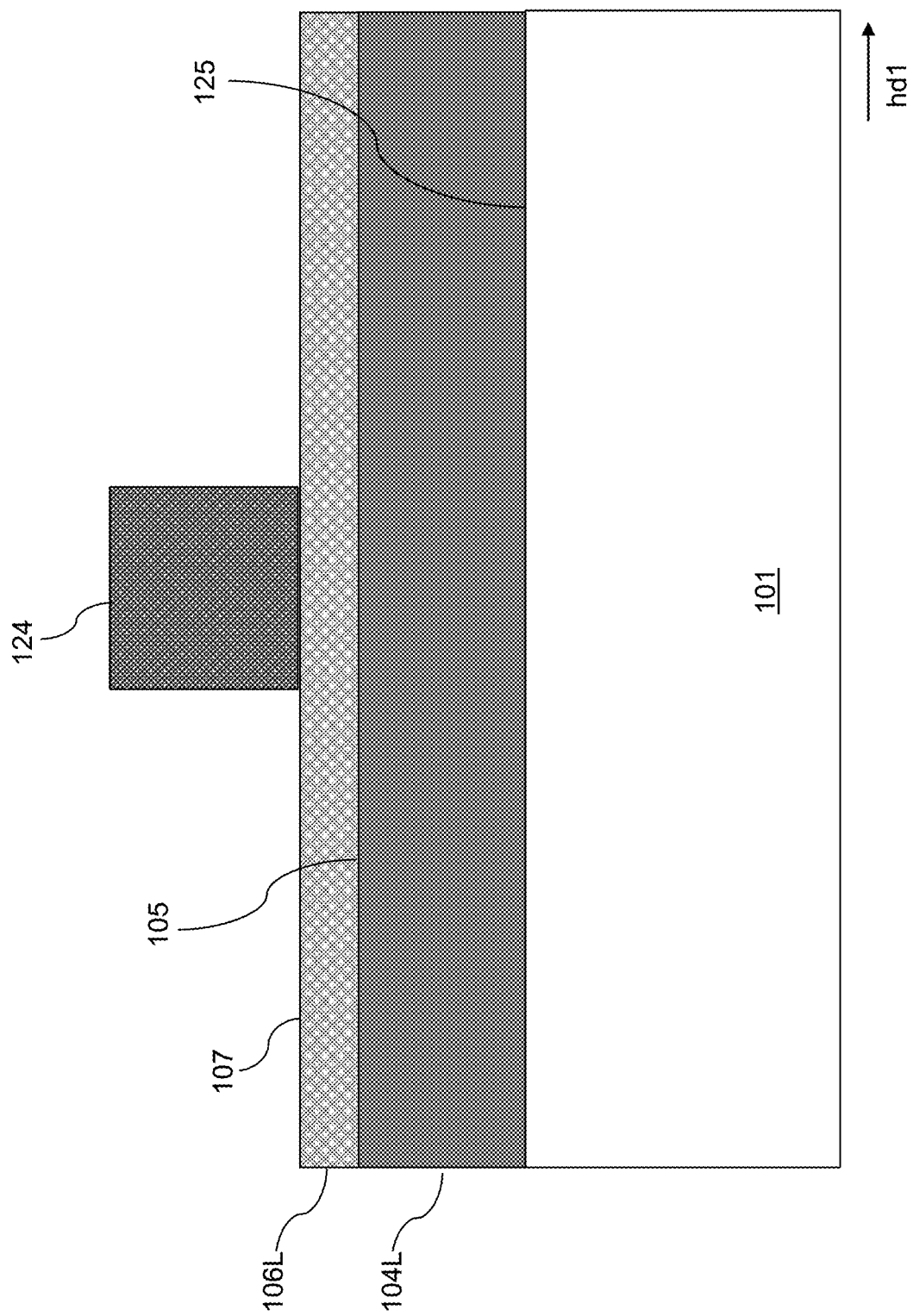
FIG. 22 is a vertical cross-section view of an exemplary intermediate structure during a process of forming a PCM switch illustrating a patterned mask over the continuous dielectric capping layer according to an embodiment of the present disclosure.

FIG. 22 is a vertical cross-section view of an exemplary intermediate structure during a process of forming a PCM switch illustrating a patterned mask 124 over the continuous dielectric capping layer 106L according to an embodiment of the present disclosure. Referring to FIG. 22, the patterned mask 124 may be formed by depositing a layer of photoresist over the upper surface 107 of the continuous dielectric capping layer 106L, and lithographically patterning the photoresist to provide the patterned mask 124. The patterned mask 124 may cover a portion of the continuous dielectric material layer 106L corresponding to the location of a heater pad and discrete dielectric capping layer to be subsequently formed.

Figure 23:
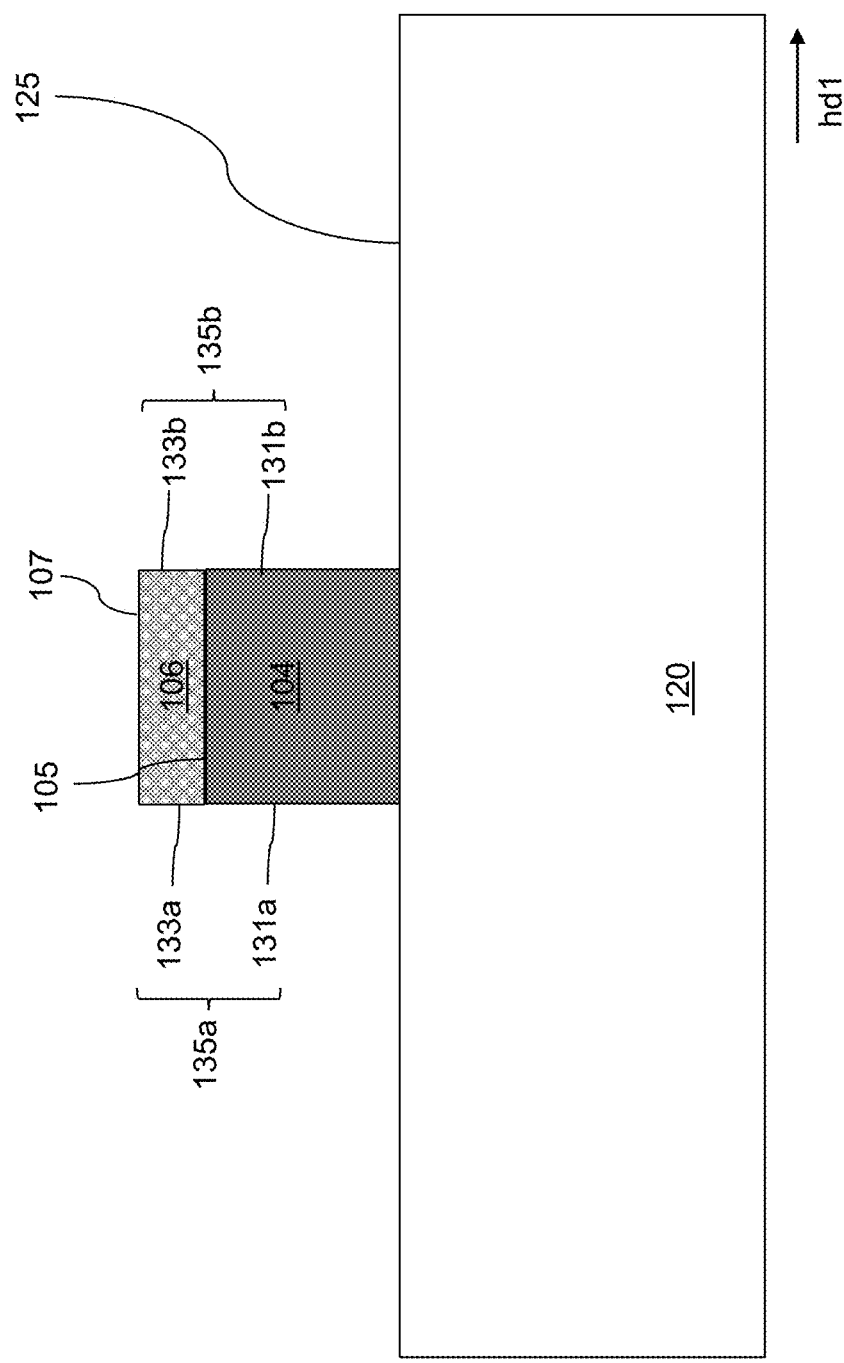
FIG. 23 is a vertical cross-section view of an exemplary intermediate structure during a process of forming a PCM switch illustrating a heater pad formed over the upper surface of the lower dielectric material layer, and a dielectric capping layer over the upper surface of the of the heater pad according to an embodiment of the present disclosure.

FIG. 23 is a vertical cross-section view of an exemplary intermediate structure during a process of forming a PCM switch illustrating a heater pad 104 formed over the upper surface 102 of the lower dielectric material layer 120, and a dielectric capping layer 106 over the upper surface of the 105 of the heater pad 104 according to an embodiment of the present disclosure. Referring to FIG. 23, an anisotropic etching process may be performed to etch unmasked portions of the continuous dielectric capping layer 106L and the continuous heater material layer 104L to provide a discrete heater pad 104 over the upper surface 125 of the lower dielectric material layer 120, and a discrete second dielectric layer 106 over the upper surface of the 105 of the heater pad 104. The dielectric capping layer 106 and the heater pad 104 and may be similar to the embodiment shown in FIG. 8A in that side surface 133a of the dielectric capping layer 106 and side surface 131a of the underlying heater pad 104 may form a first continuous surface 135a, and side surface 133b of the dielectric capping layer 106 and side surface 131b of the underlying heater pad 104 may form a second continuous surface 135b. Following the etching process, the patterned mask 120 may be removed using a suitable process, such as via ashing or dissolution using a solvent.

Figure 24:
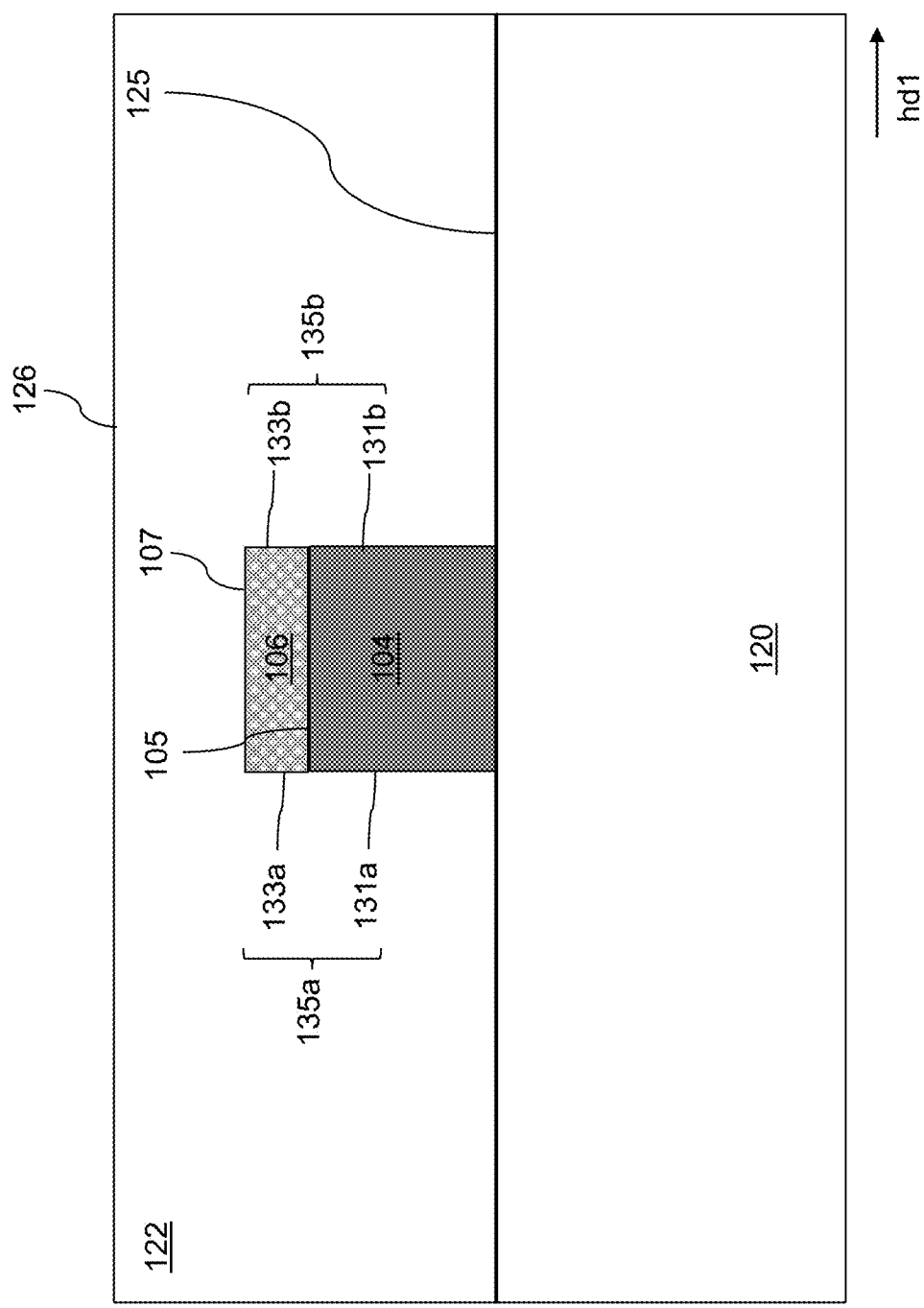
FIG. 24 is a vertical cross-section view of an exemplary intermediate structure during a process of forming a PCM switch illustrating an upper dielectric material layer formed over the upper surface of the lower dielectric material layer, over the side surfaces of the heater pad, and over the upper surface and side surfaces of the dielectric capping layer according to an embodiment of the present disclosure.

FIG. 24 is a vertical cross-section view of an exemplary intermediate structure during a process of forming a PCM switch illustrating an upper dielectric material layer 122 formed over the upper surface 125 of the lower dielectric material layer 101, over the side surfaces 131a and 131b of the heater pad 104, and over the upper surface 107 and side surfaces 133a and 133b of the dielectric capping layer 106 according to an embodiment of the present disclosure. Referring to FIG. 24, the upper dielectric material layer 122 may include a suitable dielectric material and may be deposited using a suitable deposition process as described above. In some embodiments, the upper dielectric material layer 122 may have the same composition as the lower dielectric material layer 120. Alternatively, the upper dielectric material layer 122 may have a different composition than the lower dielectric material layer 120.

Figure 25:
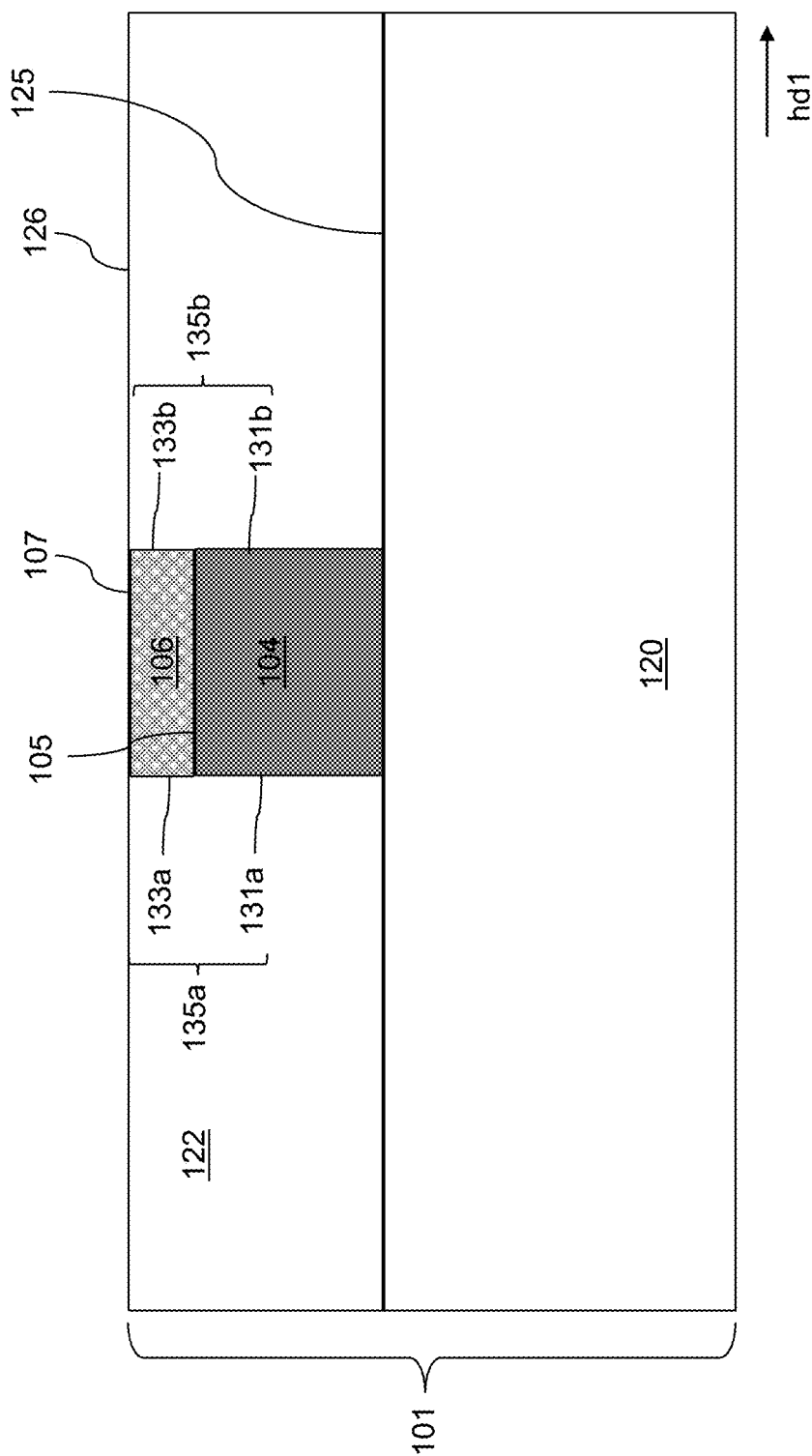
FIG. 25 is a vertical cross-section view of an exemplary intermediate structure during a process of forming a PCM switch following a planarization process that removes a portion of the upper dielectric material layer from over the upper surface of the dielectric capping layer according to an embodiment of the present disclosure.

FIG. 25 is a vertical cross-section view of an exemplary intermediate structure during a process of forming a PCM switch following a planarization process that removes a portion of the upper dielectric material layer 122 from over the upper surface 107 of the dielectric capping layer 106 according to an embodiment of the present disclosure. Referring to FIG. 25, a planarization process, such as a chemical mechanical planarization (CMP) may be used to remove a portion of the upper dielectric material layer 122 from over the upper surface 107 of the dielectric capping layer 106. Following the planarization process, the upper surface 126 of the upper dielectric material layer 122 may be co-planar with the upper surface 107 of the dielectric capping layer 106. The lower dielectric material layer 120 and the upper dielectric material layer 121 may together form a first dielectric material layer 101 such as shown in FIGS. 8A and 8B, where the first dielectric material layer 101 may contact the lower surface of the heater pad 104 and may laterally surround the heater pad 104 and the dielectric capping layer 106.

The processing steps described above with reference to FIGS. 9-15B may then be performed to form a PMC switch 100 in accordance with an embodiment of the present disclosure.

Figure 26:
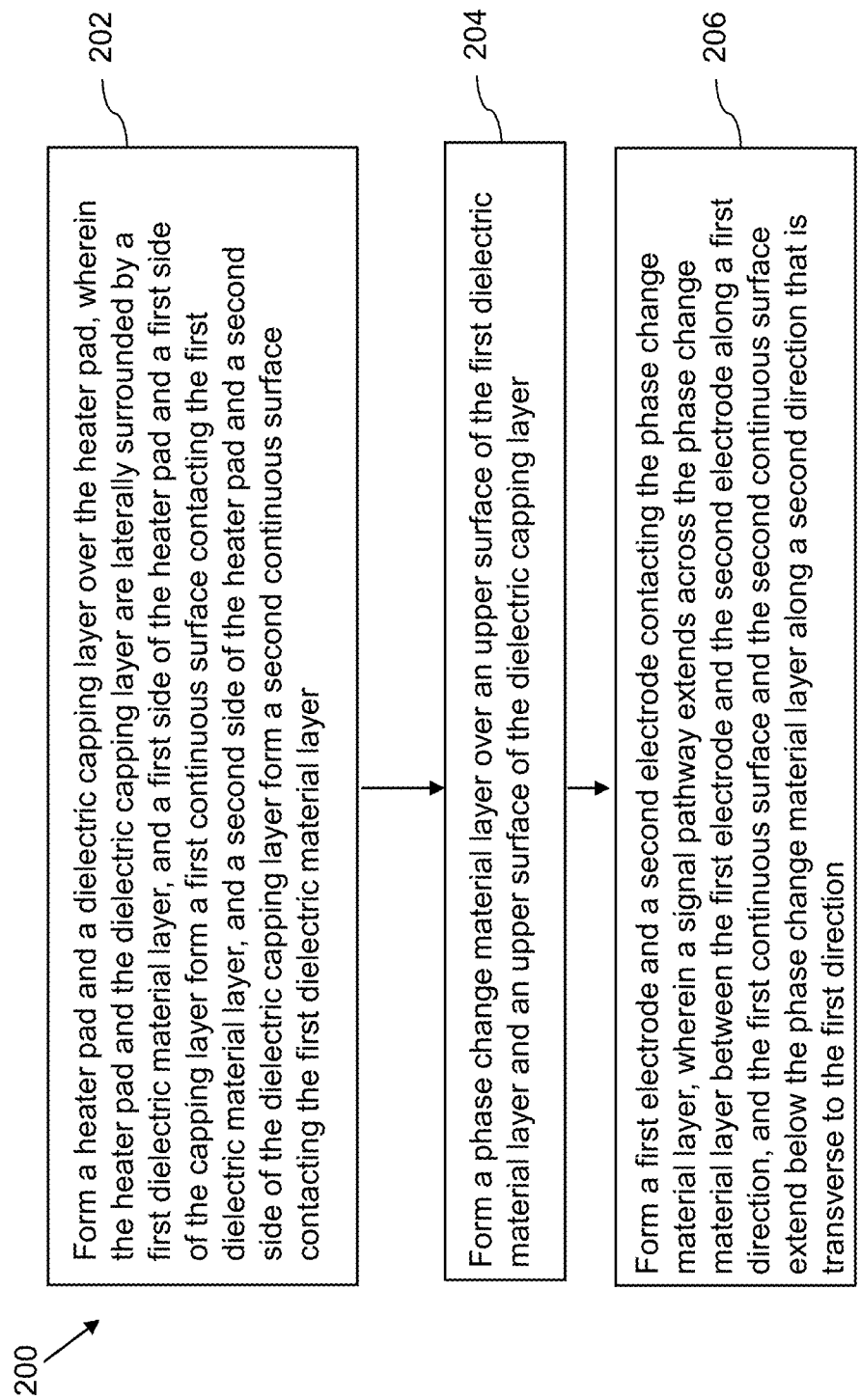
FIG. 26 is a flowchart illustrating a method of fabricating a PCM switch according to an embodiment of the present disclosure.

FIG. 26 is a flowchart illustrating a method 200 of fabricating a PCM switch 100 according to an embodiment of the present disclosure. Referring to FIGS. 2-8B and in step 202 of embodiment method 200, a heater pad 104 and a dielectric capping layer 106 over the heater pad 104 may be formed, where the heater pad 104 and the dielectric capping layer 106 are laterally surrounded by a first dielectric material layer 101, and a first continuous surface 135a contacting the first dielectric material layer 101 comprises a first side 131a of the heater pad 104 and a first side 133a of the dielectric capping layer 106, and a second continuous surface 135b contacting the first dielectric material layer 101, 122 comprises a second side 131b of the heater pad 104 and a second side 133b of the dielectric capping layer 106.

In some embodiments, as shown in FIGS. 2-8B, the heater pad 104 may be formed by forming a trench 103 in the first dielectric material layer 101, depositing a continuous heater material layer 104L formed over upper surface 102 of the first dielectric material layer 101 and within the trench 103, performing a planarization process to remove portions of the continuous heater material layer 104L from over the upper surface 102 of the first dielectric material layer 101 to provide a heater pad 104 laterally surrounded by the first dielectric material layer 101. The capping layer 106 may be formed by performing a recess etch to vertically recess the upper surface 105 of the heater pad 104 relative to the upper surface 102 of the first dielectric material layer 101, depositing a continuous dielectric capping layer 106L over the upper surface 102 of the first dielectric material layer 101 and over the upper surface 105 of the heater pad 104, and performing a planarization process to remove portions of the continuous dielectric capping layer 106L from over the upper surface 102 of the first dielectric material layer 101 to provide a dielectric capping layer 106 over the upper surface 105 of the heater pad 104.

In other embodiments, as shown in FIGS. 20-25, the heater pad 104 and the dielectric capping layer 106 may be formed by depositing a continuous heater material layer 104L over the upper surface 125 of a lower dielectric material layer 120, depositing a continuous dielectric capping layer 106L over the upper surface 105 of the continuous heater material layer 104L, etching the continuous dielectric capping layer 106L and the continuous heater material layer 104L through a patterned mask 124 to provide a discrete heater pad 104 over the upper surface 125 of the lower dielectric material layer 120 and a discrete dielectric capping layer 106 over the upper surface 105 of the heater pad 104, forming an upper dielectric material layer 121 over the upper surface 125 of the lower dielectric material layer 120, over the sides 131a, 131b of the heater pad 104, and over the sides 133a, 133b and upper surface 107 of the dielectric capping layer 106, and performing a planarization process to remove the upper dielectric material layer 121 from over the upper surface 107 of the dielectric capping layer 106 to provide the heater pad 104 and the dielectric capping layer 106 embedded within a first dielectric layer 101 formed by the lower dielectric material layer 120 and the upper dielectric material layer 121.

Referring to FIGS. 9-11B and 26, in step 204 of embodiment method 200, a phase change material layer 108 may be formed over an upper surface 102 of the first dielectric material layer 101 and an upper surface 107 of the dielectric capping layer 106. Referring to FIGS. 12-14B and 26, in step 206 of embodiment method 200, a first electrode 113 and a second electrode 114 may be formed contacting the phase change material layer 108, where a signal pathway extends across the phase change material layer 108 between the first electrode 113 and the second electrode 114 along a first direction hd1, and the first continuous surface 135a and the second continuous surface 135b extend below the phase change material layer 108 along a second direction hd2 that is transverse to the first direction hd1.

Referring to all drawings and according to various embodiments of the present disclosure, a phase change material (PCM) switch 100 includes a phase change material layer 108, a first electrode 113 contacting the phase change material layer 108, a second electrode 114 contacting the phase change material layer 108, where a signal pathway extends through the phase change material layer 108 between the first electrode 113 and the second electrode 114 along a first direction hd1, a heater pad 104 configured to heat a portion of the phase change material layer 108, the heater pad 104 including a first side 131a and a second side 131b opposite the first side 131a, and a dielectric capping layer 106 between a surface 107 of the heater pad 104 and the phase change material layer 108, the dielectric capping layer 106 including a first side 133a and a second side 133b opposite the first side 133a, and a first continuous surface 135a comprises the first side 133a of the dielectric capping layer 106 and the first side 131a of the heater pad 104, a second continuous surface 135a comprises the second side 133b of the dielectric capping layer 106 and the second side 131b of the heater pad 104, and the first continuous surface 135a and the second continuous surface 135b extend in a second direction hd2 that is transverse to the first direction hd1.

In one embodiment, the PCM switch further includes a first dielectric material layer 101 laterally surrounding the heater pad 104 and the dielectric capping layer 106, the phase change material layer 108 extending over an upper surface 102 of the first dielectric material layer 101 and an upper surface 107 of the dielectric capping layer.

In another embodiment, the first electrode 113 includes a first horizontal portion 136 over the upper surface 102 of the first dielectric material layer 101, a second horizontal portion 137 over an upper surface 109 of the phase change material layer 108, and a vertical portion 138 extending over a side surface of the phase change material layer 108 between the first horizontal portion 136 and the second horizontal portion 137, and the second electrode 114 includes a first horizontal portion 136 over the upper surface 102 of the first dielectric material layer 101, a second horizontal portion 137 over an upper surface 109 of the phase change material layer 108, and a vertical portion 138 extending over a side surface of the phase change material layer 108 between the first horizontal portion 136 and the second horizontal portion 137.

In another embodiment, the PCM switch further includes a second dielectric material layer 140 over the first dielectric material layer 101, the phase change material layer 108, the dielectric capping layer 106, and the first and second electrodes 113, 114, and a first pair of electrical contacts 141, 142 extend through the second dielectric layer 140 and contact the first electrode 113 and the second electrode 114.

In another embodiment, the PCM switch further includes a second pair of electrical contacts 143, 144 extending through the second dielectric material layer 140 and the dielectric capping layer 106 and contacting the heater pad 104 on opposite sides of the phase change material layer 108.

In another embodiment, a thermal conductivity of the dielectric capping layer 106 is greater than a thermal conductivity of the first dielectric material layer 101.

In another embodiment, the dielectric capping layer 106 includes at least one of silicon nitride, silicon carbide, silicon carbide nitride, and aluminum nitride.

In another embodiment, the heater pad 104 is configured to heat an active region 116 of the phase change material layer 108 that is located within the signal pathway to cause the active region 116 of the phase change material layer 108 to selectively transition between a low resistivity state and a high resistivity state.

In another embodiment, the phase change material layer 108 includes at least one of a germanium telluride compound, an antimony telluride compound, a germanium antimony telluride compound, a germanium antimony compound, an indium germanium telluride compound, an aluminum selenium telluride compound, an indium selenium telluride compound, and an aluminum indium selenium telluride compound.

In another embodiment, the heater pad 104 includes at least one of tungsten, tungsten nitride, titanium nitride, and a nickel silicide.

In another embodiment, the phase change material layer 108 has a greater lateral dimension along the first direction hd1 than the heater pad 104 and the dielectric capping layer 106, and the phase change material layer 108 has a smaller lateral dimension along the second direction hd2 than the heater pad 104 and the dielectric capping layer 106.

In another embodiment, the PCM switch is a radiofrequency (RF) switch.

Another embodiment is drawn to a phase change material (PCM) switch 100 including a heater pad 104, a dielectric capping layer 106 over an upper surface 105 of the heater pad 104, a phase change material layer 108 over the upper surface 107 of the dielectric capping layer 106, a first electrode 113 contacting a first side of the phase change material layer 108, and a second electrode 114 contacting a second side of the phase change material layer 108, where the dielectric capping layer 106 is laterally offset from the first and second electrodes 113, 114 such that the dielectric capping layer 106 does not extend to respective vertical planes 161a, 161b containing the peripheral edges of the first electrode 113 and the second electrode 114 facing toward the heater pad 104.

In one embodiment, the PCM switch further includes a first dielectric material layer 101 laterally adjacent to the dielectric capping layer 106 and extending between first and second sides 133a, 133b of the dielectric capping layer 106 and the respective vertical planes 161a, 161b containing the peripheral edges of the first electrode 113 and the second electrode 114 facing toward the heater pad 104.

In another embodiment, the first dielectric material layer 101 has a lower dielectric constant than the dielectric capping layer 106.

In another embodiment, the first dielectric material layer 101 is laterally adjacent to first and second sides 131a, 131b of the heater pad 104, and the first side 131a of the heater pad 104 and a first continuous surface 135a contacting the first dielectric material layer 101 comprises the first side 133a of the dielectric capping layer 106, and the second side 131b of the heater pad 104 and a second continuous surface 135b contacting the first dielectric material layer 101 comprise the second side 133b of the dielectric capping layer 106.

Another embodiment is drawn to a method of fabricating a phase change material (PCM) switch 100 that includes forming a heater pad 104 and a dielectric capping layer 106 over the heater pad 104, where the heater pad 104 and the dielectric capping layer 106 are laterally surrounded by a first dielectric material layer 101, and a first continuous surface 135a contacting the first dielectric material layer 101 comprise a first side 131a of the heater pad 104 and a first side 133a of the dielectric capping layer 106, and a second continuous surface 135b contacting the first dielectric material layer 101 comprises a second side 131b of the heater pad 104 and a second side 133b of the dielectric capping layer 106, forming a phase change material layer 108 over an upper surface 102 of the first dielectric material layer 101 and an upper surface 107 of the dielectric capping layer 106, and forming a first electrode 113 and a second electrode 114 contacting the phase change material layer 108, where a signal pathway extends across the phase change material layer 108 between the first electrode 113 and the second electrode 114 along a first direction hd1, and the first continuous surface 135a and the second continuous surface 135b extend below the phase change material layer 108 along a second direction hd2 that is transverse to the first direction hd1.

In one embodiment, forming the heater pad 104 includes forming a trench 103 in the first dielectric material layer 101, depositing a continuous heater material layer 104L over the upper surface 102 of the first dielectric material layer 101 and within the trench 103, and performing a planarization process to remove portions of the continuous heater material layer 104L from over the upper surface 102 of the first dielectric material layer 101 to provide a heater pad 104 laterally surrounded by the first dielectric material layer 101.

In another embodiment, forming the dielectric capping layer 106 includes performing a recess etch to vertically recess the upper surface 105 of the heater pad 104 relative to the upper surface 102 of the first dielectric material layer 101, depositing a continuous dielectric capping layer 106L over the upper surface 102 of the first dielectric material layer 101 and over the upper surface 105 of the heater pad 104, and performing a planarization process to remove portions of the continuous dielectric capping layer 106L from over the upper surface 102 of the first dielectric material layer 101 to provide a dielectric capping layer 106 over the upper surface 105 of the heater pad 104.

In another embodiment, forming the heater pad 104 and the dielectric capping layer 106 includes depositing a continuous heater material layer 104L over the upper surface 125 of a lower dielectric material layer 120, depositing a continuous dielectric capping layer 106L over the upper surface 105 of the continuous heater material layer 104L, etching the continuous dielectric capping layer 106L and the continuous heater material layer 104L through a patterned mask 124 to provide a discrete heater pad 104 over the upper surface 125 of the lower dielectric material layer 120 and a discrete dielectric capping layer 106 over the upper surface 105 of the heater pad 104, forming an upper dielectric material layer 121 over the upper surface 125 of the lower dielectric material layer 120, over the sides 131a, 131b of the heater pad 104, and over the sides 133a, 133b and upper surface 107 of the dielectric capping layer 105, and performing a planarization process to remove the upper dielectric material layer 121 from over the upper surface 107 of the dielectric capping layer 106 to provide the heater pad 104 and the dielectric capping layer 106 embedded within the first dielectric material layer 101 comprising the lower dielectric material layer 120 and the upper dielectric material layer 121.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase change material (PCM) switch, comprising:
   a phase change material layer;
   a first electrode contacting the phase change material layer;
   a second electrode contacting the phase change material layer, wherein a signal pathway extends through the phase change material layer between the first electrode and the second electrode along a first direction;
   a heater pad configured to heat a portion of the phase change material layer, the heater pad comprising a first side and a second side opposite the first side; and
   a dielectric capping layer between a surface of the heater pad and the phase change material layer, the dielectric capping layer comprising a first side and a second side opposite the first side, wherein a first continuous side surface comprises the first side of the dielectric capping layer and the first side of the heater pad, and a second continuous side surface comprises the second side of the dielectric capping layer and the second side of the heater pad, and the first continuous side surface and the second continuous side surface extend along a second direction that is transverse to the first direction.

2. The PCM switch of claim 1, further comprising:
   a first dielectric material layer laterally surrounding the heater pad and the dielectric capping layer, the phase change material layer extending over an upper surface of the first dielectric material layer and an upper surface of the dielectric capping layer.

3. The PCM switch of claim 2, further comprising:
   a second dielectric material layer over the first dielectric material layer, the phase change material layer, the dielectric capping layer, and the first and second electrodes;

a first pair of electrical contacts extending through the second dielectric layer and contacting the first electrode and the second electrode.

4. The PCM switch of claim 3, further comprising:
a second pair of electrical contacts extending through the second dielectric material layer and the dielectric capping layer and contacting the heater pad on opposite sides of the phase change material layer.

5. The PCM switch of claim 2, wherein:
the first electrode comprises a first horizontal portion over the upper surface of the first dielectric material layer, a second horizontal portion over an upper surface of the phase change material layer, and a vertical portion extending over a side surface of the phase change material layer between the first horizontal portion and the second horizontal portion, and
the second electrode comprises a first horizontal portion over the upper surface of the first dielectric material layer, a second horizontal portion over an upper surface of the phase change material layer, and a vertical portion extending over a side surface of the phase change material layer between the first horizontal portion and the second horizontal portion.

6. The PCM switch of claim 2, wherein a thermal conductivity of the dielectric capping layer is greater than a thermal conductivity of the first dielectric material layer.

7. The PCM switch of claim 1, wherein the heater pad is configured to heat an active region of the phase change material layer that is located within the signal pathway to cause the active region of the phase change material layer to selectively transition between a low resistivity state and a high resistivity state.

8. The PCM switch of claim 7, wherein the phase change material layer comprises at least one of a germanium telluride compound, an antimony telluride compound, a germanium antimony telluride compound, a germanium antimony compound, an indium germanium telluride compound, an aluminum selenium telluride compound, an indium selenium telluride compound, and an aluminum indium selenium telluride compound.

9. The PCM switch of claim 7, wherein the heater pad comprises at least one of tungsten, tungsten nitride, titanium nitride, and a nickel silicide.

10. The PCM switch of claim 1, wherein the dielectric capping layer comprises at least one of silicon nitride, silicon carbide, silicon carbide nitride, and aluminum nitride.

11. The PCM switch of claim 1, wherein the phase change material layer has a greater lateral dimension along the first direction than the heater pad and the dielectric capping layer, and the phase change material layer has a smaller lateral dimension along the second direction than the heater pad and the dielectric capping layer.

12. The PCM switch of claim 1, wherein the PCM switch comprises a radiofrequency (RF) switch.

13. A phase change material (PCM) switch, comprising:
a heater pad;
a dielectric capping layer over an upper surface of the heater pad;
a phase change material layer over the upper surface of the dielectric capping layer;
a first electrode contacting a first side of the phase change material layer; and
a second electrode contacting a second side of the phase change material layer, wherein the dielectric capping layer is laterally offset from the first electrode and the second electrode such that the dielectric capping layer does not extend to respective vertical planes containing peripheral edges of the first electrode and the second electrode facing toward the heater pad.

14. The PCM switch of claim 13, further comprising:
a first dielectric material layer laterally adjacent to the dielectric capping layer and extending between first and second sides of the dielectric capping layer and the respective vertical planes containing the peripheral edges of the first electrode and the second electrode facing toward the heater pad.

15. The PCM switch of claim 14, wherein the first dielectric material layer has a lower dielectric constant than the dielectric capping layer.

16. The PCM switch of claim 14, wherein the first dielectric material layer is laterally adjacent to first and second sides of the heater pad, and a first continuous surface contacting the first dielectric material layer comprise the first side of the heater pad and the first side of the dielectric capping layer, and a second continuous surface contacting the first dielectric material layer comprise the second side of the heater pad and the second side of the dielectric capping layer.

17. A method of fabricating a phase change material (PCM) switch, comprising:
forming a heater pad and a dielectric capping layer over the heater pad, wherein the heater pad and the dielectric capping layer are laterally surrounded by a first dielectric material layer, and a first continuous surface contacting the first dielectric material layer comprises a first side of the heater pad and a first side of the dielectric capping layer, and a second continuous surface contacting the first dielectric material layer comprises a second side of the heater pad and a second side of the dielectric capping layer;
forming a phase change material layer over an upper surface of the first dielectric material layer and an upper surface of the dielectric capping layer; and
forming a first electrode and a second electrode contacting the phase change material layer wherein a signal pathway extends across the phase change material layer between the first electrode and the second electrode along a first direction, and the first continuous surface and the second continuous surface extend below the phase change material layer along a second direction that is transverse to the first direction.

18. The method of claim 17, wherein forming the heater pad comprises:
forming a trench in the first dielectric material layer;
depositing a continuous heater material layer over the upper surface of the first dielectric material layer and within the trench; and
performing a planarization process to remove portions of the continuous heater material layer from over the upper surface of the first dielectric material layer to provide a heater pad laterally surrounded by the first dielectric material layer.

19. The method of claim 18, wherein forming the dielectric capping layer comprises:
performing a recess etch to vertically recess the upper surface of the heater pad relative to the upper surface of the first dielectric material layer;
depositing a continuous dielectric capping layer over the upper surface of the first dielectric material layer and over the upper surface of the heater pad; and
performing a planarization process to remove portions of the continuous dielectric capping layer from over the upper surface of the first dielectric material layer to provide a dielectric capping layer over the upper surface of the heater pad.

20. The method of claim 17, wherein forming the heater pad and the dielectric capping layer comprises:
depositing a continuous heater material layer over the upper surface of a lower dielectric material layer;
depositing a continuous dielectric capping layer over the upper surface of the continuous heater material layer;
etching the continuous dielectric capping layer and the continuous heater material layer through a patterned mask to provide a discrete heater pad over the upper surface of the lower dielectric material layer and a discrete dielectric capping layer over the upper surface of the heater pad;
forming an upper dielectric material layer over the upper surface of the lower dielectric material layer, over the sides of the heater pad, and over the sides and upper surface of the dielectric capping layer; and
performing a planarization process to remove the upper dielectric material layer from over the upper surface of the dielectric capping layer to provide the heater pad and the dielectric capping layer embedded within the first dielectric material layer comprising the lower dielectric material layer and the upper dielectric material layer.

* * * * *